(12) United States Patent
Selten et al.

(10) Patent No.: US 12,015,372 B2
(45) Date of Patent: Jun. 18, 2024

(54) SOLAR PANEL

(71) Applicant: Solarge Holding B.V., Eindhoven (NL)

(72) Inventors: Wilhelmus Nicolaas Maria Selten, Erp (NL); Stefan Henricus Maria Zwegers, Eindhoven (NL); Menno Nicolaas Van Den Donker, Weert (NL); Huibert Johan Van Den Heuvel, Eindhoven (NL); Marcus Leonardus Gerardus Maria Van De Ven, Venlo (NL)

(73) Assignee: Solarge Holding B.V., Eindhoven (NL)

( * ) Notice: Subject to any disclaimer, the term of this patent is extended or adjusted under 35 U.S.C. 154(b) by 0 days.

(21) Appl. No.: 17/603,521

(22) PCT Filed: Jul. 26, 2019

(86) PCT No.: PCT/NL2019/050501
§ 371 (c)(1),
(2) Date: Oct. 13, 2021

(87) PCT Pub. No.: WO2020/214023
PCT Pub. Date: Oct. 22, 2020

(65) Prior Publication Data
US 2022/0190773 A1  Jun. 16, 2022

(30) Foreign Application Priority Data
Apr. 15, 2019  (NL) .................................. 2022944

(51) Int. Cl.
*H02S 20/24* (2014.01)
*H02S 30/10* (2014.01)

(52) U.S. Cl.
CPC ............. *H02S 20/24* (2014.12); *H02S 30/10* (2014.12)

(58) Field of Classification Search
CPC ....... H01L 31/00–078; Y02E 10/50–60; H02S 20/00–32
(Continued)

(56) References Cited

U.S. PATENT DOCUMENTS 7,921,843 B1 *  4/2011  Rawlings ................ H02S 20/24
                                                52/90.2
2003/0210966 A1 * 11/2003  Haire ..................... B62D 33/04
                                                410/96
(Continued)

FOREIGN PATENT DOCUMENTS

CN   207604590 U   7/2018
DE   20008441 U1   7/2000
(Continued)

OTHER PUBLICATIONS

European Patent Office, International Search Report in corresponding International Application No. PCT/NL2019/050501, dated Oct. 21, 2019 (3 pages).
(Continued)

*Primary Examiner* — Bach T Dinh
(74) *Attorney, Agent, or Firm* — Leydig, Voit & Mayer, Ltd.

(57) ABSTRACT

A pre-formed solar panel (1) to be mounted on a support plane (SP) is disclosed. In a direction from a first end (E1) to a second opposing end (E2), the panel has at least a first planar section (S1), a plastically deformed section (P) and a second planar section (S2), wherein the plastically deformed section maintains the first and the second planar section relative to each other at an enclosed angle (A1) in a range between 30° and 170°, and wherein an area of at least one of the planar sections is provided with a photovoltaic layer (3).

3 Claims, 24 Drawing Sheets

(58) Field of Classification Search
USPC .................................................. 136/243–265
See application file for complete search history.

(56) References Cited

U.S. PATENT DOCUMENTS

| | | | |
|---|---|---|---|
| 2007/0074755 A1* | 4/2007 | Eberspacher | H01L 31/02013 |
| | | | 136/244 |
| 2008/0145597 A1* | 6/2008 | Hendren | B29D 99/0089 |
| | | | 428/116 |
| 2009/0320898 A1 | 12/2009 | Gumm | |
| 2011/0226312 A1* | 9/2011 | Bohm | B62D 25/06 |
| | | | 136/251 |
| 2012/0090659 A1 | 4/2012 | Muchow et al. | |
| 2017/0278985 A1 | 9/2017 | Izardel | |
| 2017/0338767 A1 | 11/2017 | Shevlin | |
| 2018/0316302 A1* | 11/2018 | Okawa | H01L 31/035281 |
| 2019/0183215 A1 | 6/2019 | Sun et al. | |

FOREIGN PATENT DOCUMENTS

| | | |
|---|---|---|
| WO | WO 2014/056176 A1 | 4/2014 |
| WO | WO 2017/081538 A2 | 5/2017 |
| WO | WO 2017/172056 A1 | 10/2017 |
| WO | WO 2018/024948 A1 | 2/2018 |

OTHER PUBLICATIONS

China National Intellectual Property Administration, First Office Action in corresponding Chinese application 201980096569.3 dated Oct. 30, 2023.

* cited by examiner

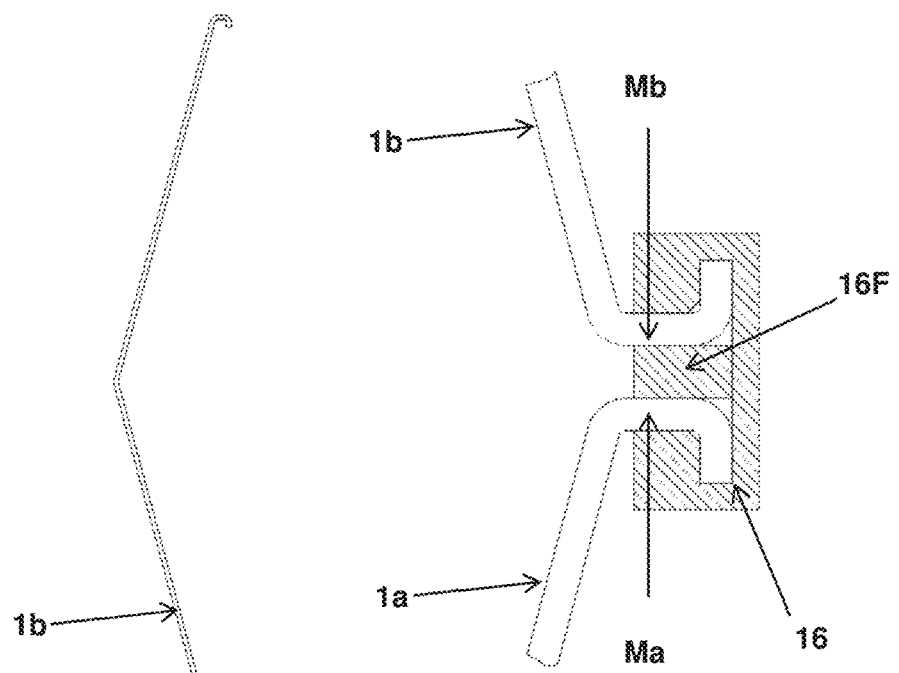
FIG 12F
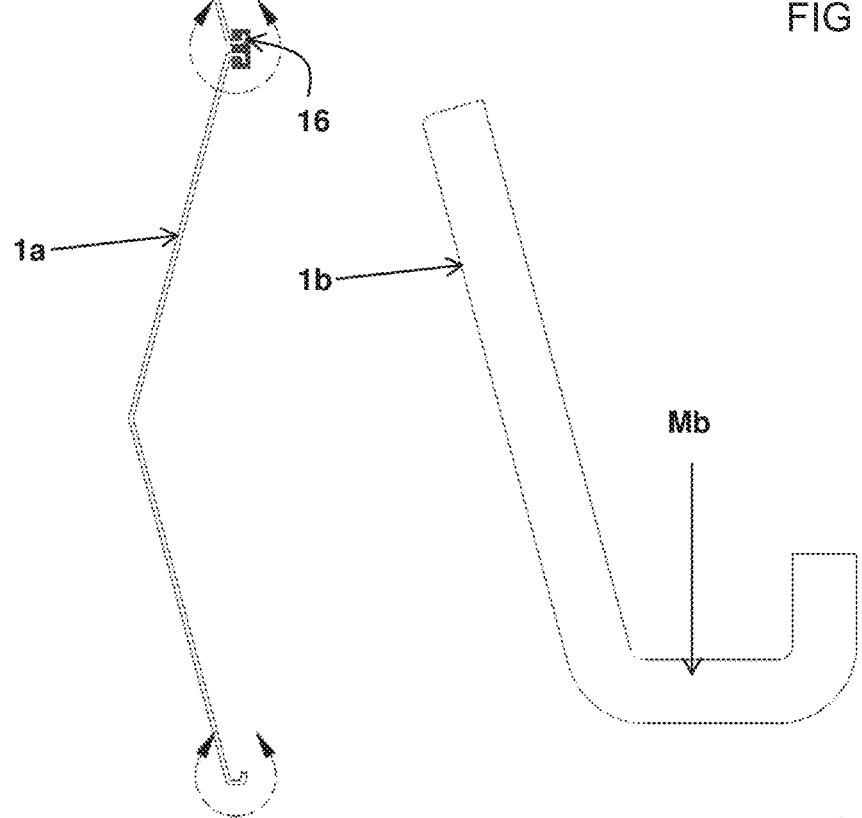
FIG 12E
FIG 12D

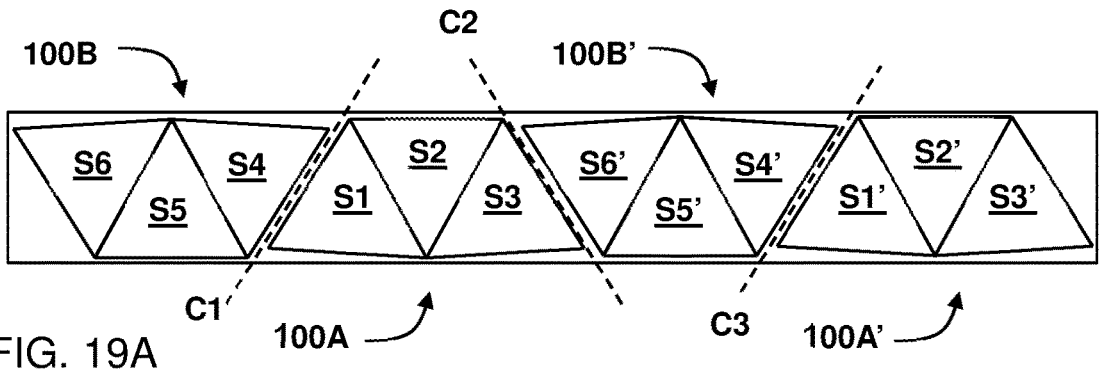
FIG. 19A
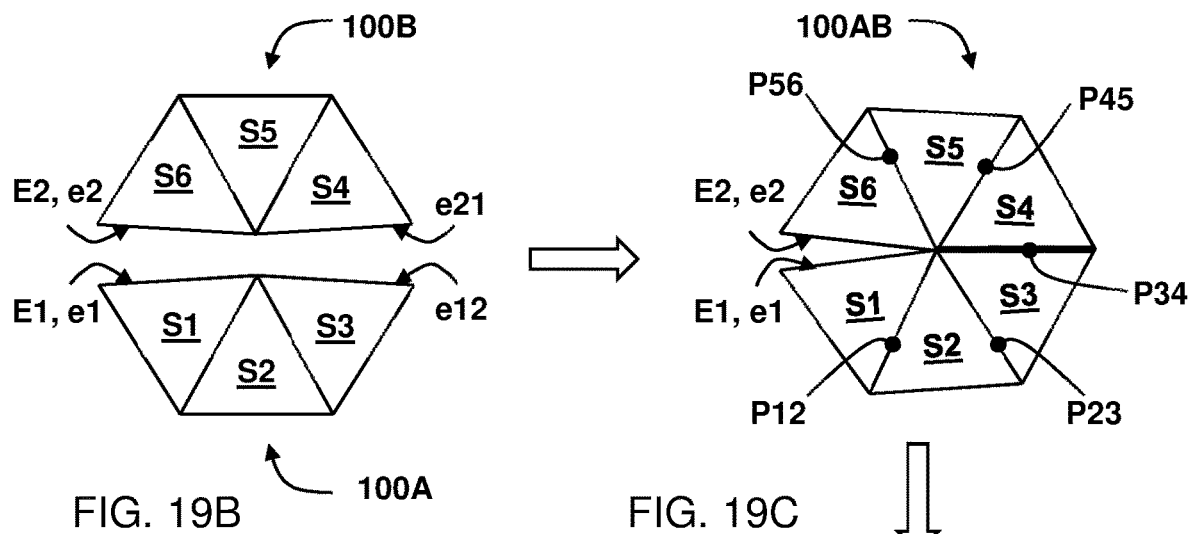
FIG. 19B
FIG. 19C
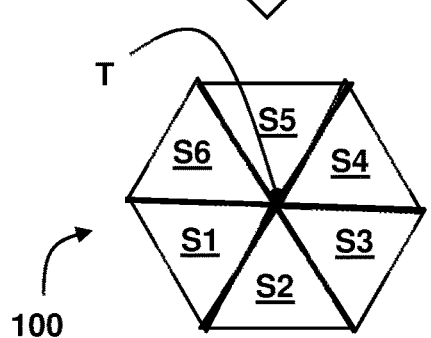
FIG. 19D

SOLAR PANEL

CROSS-REFERENCE TO RELATED APPLICATIONS

This patent application is a U.S. National Phase of PCT International Application No. PCT/NL2019/050501, filed Jul. 26, 2019, which claims priority to Netherlands Application No. 2022944, filed Apr. 15, 2019, which are both expressly incorporated by reference in their entireties, including any references contained therein.

TECHNICAL FIELD AND BACKGROUND

The present disclosure relates to solar panels, assemblies thereof, and to methods for the manufacturing thereof.

Known photovoltaic panels, also known as solar panels, typically comprise, in order from the front light-receiving side to the back: a protective front layer, a layer comprising interconnected photovoltaic elements and a back layer. Glass is widely used for the protective front layer as being suitable to, in use, protect the photovoltaic panels from externally induced damage, e.g. due to weather conditions such as rain and hail, while being sufficiently transparent to allow incident light to reach the photovoltaic cells. The back layer may also be a glass sheet, or a metal sheet or any other panel such as polymer-based panels suitable to its purpose of providing electrical insulation of the photovoltaic elements and providing a weather tight closure to the back of the photovoltaic elements.

Typically solar panels are mounted under a slanting angle. An advantage thereof is that incoming water, e.g. rain may run off the surface of the panel. Solar panels are typically mounted under an angle in excess of 10° with respect to level. By placing solar panels under an angle sufficient to drain off incoming water, contamination on the panel surface, e.g. by growth of biological material such as algae or moss may be reduced. Further panels mounted under a sufficient angle may be passive cleaned, e.g. due to incident rain washing away contamination, e.g. sand, dust, and/or soot. In order to achieve such orientation, panels including a mounting frame are commonly mounted onto a dedicated carrier structure. For example, for flat or very shallow rooftops such mounting structure may include a metallic frame that is secured to the roof. Besides assembly time and costs the weight of such dedicated carrier structures is disadvantageous. Accordingly, there exists a need to provide solar panels that can be mounted under an angle to a support structure with one or more of a reduced assembly effort, reduced material cost, and reduced weight, e.g. reduced load to the support structure.

The photovoltaic panel according the present disclosure mitigates one or more of the above or other problems.

SUMMARY

Aspects of the present disclosure relate to a pre-formed solar panel. The pre-formed solar panel is to be mounted onto a support plane of a carrier structure. The pre-formed solar panel has in a direction from a first end to a second opposing end at least a first planar section, a plastically deformed section and a second planar section. At least one of the planar sections is, at least partially, provided with a photo active layer, e.g. a photovoltaic layer. The plastically deformed section maintains the first and the second planar section relative to each other at a pre-set enclosed angle. Preferably, the enclosed angle between first and the second planar sections is in a range between 30° and 170°. The support plane may be understood to be a surface of any suitable carrier, including, but not limited to a roof (flat roof, slanted roof); a wall; a field; or any other structure for supporting a PV installation. Preferably, the pre-formed panel has a reduced weight compared to known panels provided with a glass panel. In preferred embodiments, the photovoltaic sandwich panel has a weight in a range between 1 and 50 kg/m$^2$, preferably between 5 kg/m$^2$ and 25 kg/m$^2$, most preferably between 2 kg/m$^2$ and 10 kg/m$^2$. Advantageously, panels with reduced weight, when mounted onto a structure, imply a reduced load onto the structure. This allows mounting an increased number of pre-formed solar panels and/or solar panels with increased dimensions onto a given structure, e.g. a rooftop, even for carriers with limited capability to support loads, e.g. roofs, such as corrugated roofs, of barns, halls, carparks and/or greenhouses. In some embodiments the specific weight, e.g. the weight per volume, of the panel may be such as to allow floating the pre-formed solar panel on a body of water, e.g. on a lake.

In a preferred embodiment, the stiffness of the panel between opposing ends is in a range between 100-5000 N/m. The plastically deformed section maintains the relative angle between the panel sections during normal operation, e.g. at common ambient temperatures, e.g. in a range between −40° C. and 80° C. Preferably, the pre-formed solar panel is a free standing panel. A free standing panel may be understood to include panels capable of, in its mounting position, maintaining a given desirable relative orientation between its photo active region and support structure, e.g. maintaining the angle of its panel section provided with a photo active layer. Preferably the angle is in excess of 10° relative to level. In other words, a free standing pre-formed solar panel as disclosed herein may be mounted on to a carrier structure, e.g. a rooftop without a dedicated support structure, e.g. without a frame. Advantageously, PV installations without dedicated support structures may imply a reduced load onto the carrier structure, e.g. rooftop. This allows mounting an increased number of pre-formed solar panels and/or solar panels with increased dimensions onto a given structure, e.g. a rooftop.

Preferably, the section between the first and second planar section is plastically deformable at temperatures well above ambient operation temperature. Preferably, the plastically deformed section becomes plastically deformable above 100° C., preferably in range between 100° C. and 200° C., while being rigid under normal operating temperatures, i.e. −40 to 80° C. The section between the first and second planar, i.e. the plastically deformed section, may be formed of a composition comprising a thermoplastic polymer. Suitable thermoplastic polymers include but are not limited to polyolefins (PO) such as ethylene vinyl acetate (EVA) and polypropylene (PP) and mixtures thereof.

In some preferred embodiments, the sections are formed with a common back panel. In other words, the at least a first planar section, the plastically deformed section and the second planar section comprised in the pre-formed solar panel are preferably formed with a common back panel formed of a composition comprising a thermoplastically deformable material, preferably a thermoplastic polymer. In such panels the plastically deformed section may be considered as a region over which the back panel is bent. By forming the pre-formed solar panel on a single, continuous back panel the panel may be manufactured by suitably thermoforming of a single pre-formed panel, e.g. planar panel. By forming the pre-formed solar panel from a continuous back panel, i.e. a common back panel, the preformed solar panel may form a continuous panel, e.g. a panel with continuous mechanical properties. As such the preformed solar panel may be used as a construction element, in particular for use as a water tight construction panel for spanning over roof openings, with a light weight relative to conventional roofing structures. In another or further preferred embodiment, the pre-formed solar panel may be formed by joining, e.g. welding, adjacent panels, optionally via a strip formed of a thermoplastically deformable material. In such panels the plastically deformed section may be a region over which panels are joined by a weld. Preferably, the adjacent panels are joined via a continuous weld. Providing a continuous weld may result in the formation of a pre-formed solar panel with mechanical properties, including water tightness similar to panels made from a common back panel.

In some preferred embodiments the pre-formed solar panel as described herein is, at least locally defined by the photovoltaic layer formed of a stack comprising the photovoltaic layer sandwiched, e.g. encapsulated, between the back panel and a protective front layer. In other or further preferred embodiments, pre-formed solar panel as described herein is, between the opposing ends of the panel formed of a stack comprising the photovoltaic layer, the back panel and a protective front layer. The protective front layer, is typically formed of an optically transparent composition comprising additives to protect the underlying PV-cells from external influences including but not limited to dust, sand, and weather (rain, hail, snow). The photovoltaic layer typically comprises a plurality of adjacent photovoltaic cells laid out in a pattern. Preferred PV-cells include polycrystalline and mono-crystalline Si-PV cells. It will be appreciated the present invention is not limited to crystalline Si-PV cells, also other types of cells may be used including thin film solar cells, as will be explained herein below. The back panel, like the front panel, protects the PV cells from external influences. In addition, the back panel, during manufacturing, may serve as a carrier on which the PV-cells are laid out. Further the back panel mainly determines the mechanical properties of the pre-formed panel as a whole. Proving a back panel with a stiffness in a range as described above mitigates damage to the PV cells in the solar panel that would otherwise result from bending and/or flexing, e.g. under the influence of static loads, e.g. a layer of snow, and under the influence of dynamic loads including wind load. Further the back panel along with the plastically deformed section contributes to maintaining the shape of the pre-formed solar panel. Optionally, the stiffness of the preformed solar panel may be improved by connecting the plastically deformed sections, e.g. via a separate connector element affixed to and connecting the back panels of the respective sections. Said connector element may be affixed by any suitable method, including gluing but is preferably affixed thermally, e.g. by welding. It will be appreciated that the plastically deformed section, particularly in embodiments formed with stiff, brittle PV-cells, like Si-PV cells is preferably provided between the photovoltaic cells. In other words, in such embodiments, the PV cells are not present in the plastically deformed section, e.g. the bend and/or the weld. In embodiments, provided with flexible PV cells, the PV cells may continue over a bend.

In an embodiment an embodiment of a preformed solar panel as specified is configured into a solar panel pyramid. This can be achieved with a preformed solar panel having at least three planar sections including said at least a first planar section and a second planar section. The at least three planar sections are provided as at least substantially triangular planar sections having a common top, and each planar section shares a first plastically deformed section with a first neighboring planar section, and shares a second plastically deformed section with a second neighboring planar section. The edges of the planar sections opposite the top define a base-plane of the solar panel pyramid. The plastically deformed sections include a plastically deformed section between the first end and the second opposing end of the first triangular planar section and the last triangular planar section of the preformed solar panel used to be configured into a solar panel pyramid. The wording "at least substantially triangular" implies that the planar sections are either triangularly shaped, or are triangles truncated by not more than 20% of their original height. The interior of the truncated pyramid therewith obtained can be easily accessed for maintenance. Also, this would avoid the occurrence of pressure differences in case of high wind velocities, therewith avoiding lift effects.

The pre-formed solar panel configured into a pyramid provides has a high structural integrity. Moreover, its configuration substantially reduces its sensitivity to wind forces. The number of (at least substantially) triangular planar sections may be 3 or higher. A number of 3, 4 or 6 is advantageous in that a planar area for solar energy harvesting can be efficiently covered with multiple identical species of the solar panel pyramid. Alternatively, a covering may be achieved with a combination of different embodiments of the solar panel pyramid for example using a combination of 8-sided and 4-sided solar panel pyramids. Regardless the shape of the solar panel pyramids, it may be contemplated to leave access space between neighboring species, to facilitate access. It is noted that in some embodiments, the number of triangular planar sections can be made substantially higher, e.g. in the order of tens or hundreds or more, so that the solar panel pyramid has the appearance of a solar panel cone. The size of the solar cells applied in the photovoltaic layer may be appropriately reduced, for example, to half or quarter cells. Also thin-film solar cells may be used for this purpose.

In embodiments, the base-plane of the solar panel pyramid is left open at its base plane. This embodiment is advantageous, in that a plurality of species of the solar panel pyramid can be stacked during transport, so that only a modest transport volume is required. Alternatively, the solar-panel pyramid may be closed at its base-plane. In this embodiment the solar panel pyramid has a good floating capacity, which is favorable for application in off-shore solar parks. In a very favorable embodiment, the solar panel pyramid is filled with a foam. The filling of foam can be provided at the destination, so that the solar panel pyramids can still be compactly stored and transported.

A solar-panel pyramid may comprising a control unit with a respective Maximum Power Point Tracker for each photovoltaic layer associated on triangular planar section, and having a controller for controlling said Maximum Power Point Trackers. The controller may for example have a communication interface for that purpose, which may operate wirelessly or may communicate information via the power line supplied by the solar-panel pyramid.

In an embodiment of the solar-panel pyramid, the photovoltaic layer of the triangular planar sections is preferably provided with one of back contact solar cells or thin film solar cells. This facilitates a step of providing for an external electrical connection, in that the photovoltaic layer may simply be laminated with a power collection back plane.

A solar-panel pyramid arrangement may be provided from a plurality of solar-panel pyramids. Mutually neighboring solar-panel pyramids may be mechanically coupled in a flexible manner. The solar-panel pyramid arrangement according to this embodiment is suitable for mounting on uneven surfaces, or to float on a water surface. The flexible coupling between neighboring solar-panel pyramids may be provided as an open structure to facilitate draining of rainwater. The flexible connections may be provided as a continuous sheet of an elastic material, such as rubber, or as discrete coupling elements, such as springs. In another embodiment the solar-panel pyramids in solar-panel pyramid arrangement are connected to a web. The web may be pre-tensioned to reduce the risk of collisions. Alternatively, buffer elements may be provided between neighboring solar-panel pyramids.

A solar-panel pyramid arrangement covering a larger surface area, may be provided with maintenance paths extending through the arrangement, to enable access of individual solar-panel pyramids. The maintenance paths may be mechanically coupled to adjoining solar-panel pyramids. This contributes to the mechanical integrity of the arrangement. Furthermore, in off-shore applications the maintenance paths may be supported by the floating solar-panel pyramids.

In a floating solar-panel pyramid arrangement, openings may be provided to allow access of external light to the water surface to the benefit of sea-life, e.g. fish, plants and algae.

Various options are possible to configure preformed solar panels into a solar panel pyramid. In one embodiment a preformed solar panel is provided with at least three, at least substantially triangular planar sections and which has each pair of mutually subsequent substantially triangular planar sections coupled by a respective plastically deformed section. A first edge portion of a first one of the substantially triangular planar sections defines the first end and a second edge portion of a last one of the at least substantially triangular planar sections defines the second opposing end.

The first and the second edge portion of the preformed solar panel are then contacted and heated for a time and temperature suitable to fuse the first one and the last one of the substantially triangular planar sections along a plastically deformed section to form the solar panel pyramid. A contacting of the first and the second edge portion may be optionally via a strip of a thermoplastically deformable material. In that case also that strip is heated according proper time and temperature conditions to achieve a fusing with the first and the second edge portion.

The preformed solar panel used for this purpose may be directly obtained by properly deforming an intermediary planar product. Alternatively, two smaller preformed solar panels that together have the number of substantially triangular planar sections of the preformed solar panel to be configured in a solar panel pyramid may be merged. Generally the smaller preformed solar panels can be obtained from a planar intermediary product with more efficiency. The first preformed solar panel has the first edge portion as well as a first intermediate edge portion. The second preformed solar panel has the second edge portion, and further has a second intermediate edge-portion, For example two preformed solar panels with each three substantially triangular planar sections may be merged to form a single preformed solar panel with six substantially triangular planar sections that is subsequently configured into a six-sided solar panel pyramid. The smaller preformed solar panel can be merged by contacting and heating the first and the second intermediate edge portion for a time and temperature suitable to fuse the first and the second preformed solar panel to obtain the preformed solar panel that is to be configure into a solar panel pyramid. A contacting of the first and the second intermediate edge portion may be optionally via a strip of a thermoplastically deformable material. In that case also that strip is heated according proper time and temperature conditions to achieve a fusing with the first and the second edge portion.

BRIEF DESCRIPTION OF DRAWINGS

These and other features, aspects, and advantages of the apparatus, systems and methods of the present disclosure will become better understood from the following description, appended claims, and accompanying drawing wherein:

FIG. 19A-19D schematically show an aspect of a method of manufacturing a solar panel pyramid;

DESCRIPTION OF EMBODIMENTS

Figure 1A:
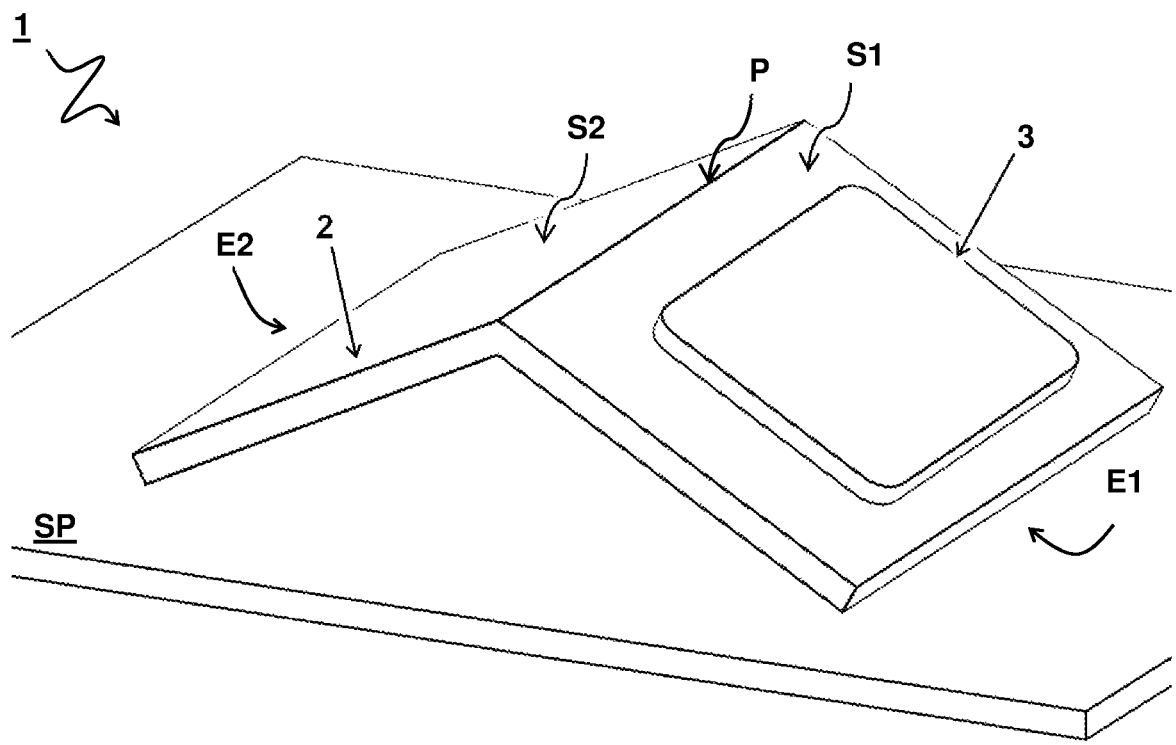
FIG. 1A schematically depicts a perspective view of an embodiments of a pre-formed solar panel on a support plane.

Terminology used for describing particular embodiments is not intended to be limiting of the invention. As used herein, the singular forms "a", "an" and "the" are intended to include the plural forms as well, unless the context clearly indicates otherwise. The term "and/or" includes any and all combinations of one or more of the associated listed items. It will be understood that the terms "comprises" and/or "comprising" specify the presence of stated features but do not preclude the presence or addition of one or more other features. It will be further understood that when a particular step of a method is referred to as subsequent to another step, it can directly follow said other step or one or more intermediate steps may be carried out before carrying out the particular step, unless specified otherwise. Likewise it will be understood that when a connection between structures or components is described, this connection may be established directly or through intermediate structures or components unless specified otherwise.

As used herein photovoltaic cells be rigid cells, such as crystalline silicon solar cells (c-Si). c-Si cell thickness typically is in a range between 0.15 and 0.25 mm. Alternatively, the photovoltaic cells can be flexible in nature. Suitable PV cells include, but are not limited to thin film PV cells, such as thin film silicon, CIGS (Copper indium gallium selenide cells), OPV (Organic PhotoVoltaic cells), polymer solar cells, Perovskite solar cells, multi-junction cells, dye-sensitized cells, and quantum dot solar cells.

As used herein encapsulant layers are typically used with a thickness in a range between 0.05 and 2 mm, such as 1.2 mm, 1.1 mm 1 mm and 0.09 mm. Preferably, encapsulant layers may be thinner e.g. in a range between 0.2 mm and 0.5 mm, e.g. 0.4 mm.

The invention is described more fully hereinafter with reference to the accompanying drawings, in which embodiments of the invention are shown. In the drawings, the absolute and relative sizes of systems, components, layers, and regions may be exaggerated for clarity. Embodiments may be described with reference to schematic and/or cross-section illustrations of possibly idealized embodiments and intermediate structures of the invention. In the description and drawings, like numbers refer to like elements throughout. Relative terms as well as derivatives thereof should be construed to refer to the orientation as then described or as shown in the drawing under discussion. These relative terms are for convenience of description and do not require that the system be constructed or operated in a particular orientation unless stated otherwise.

Figure 1B:
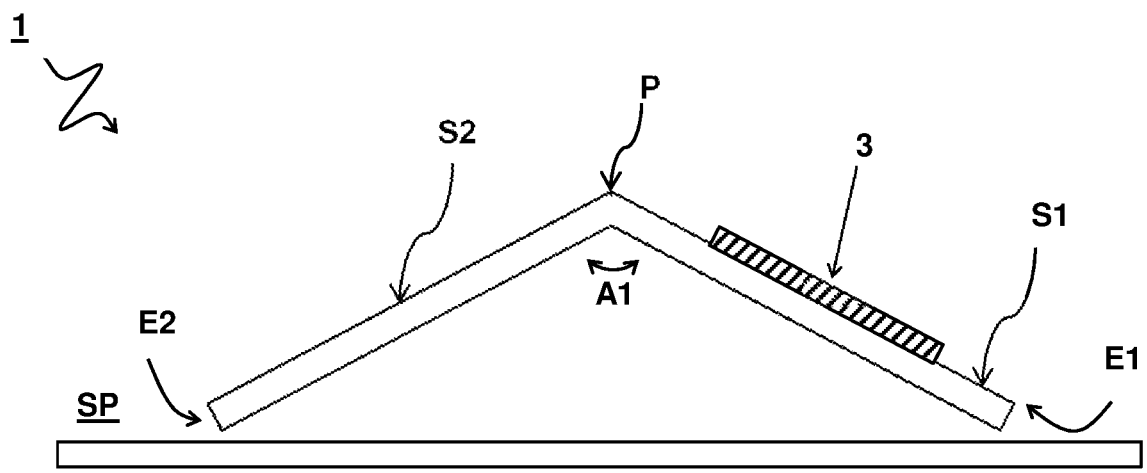
FIG. 1B-C schematically depicts cross-section side views of embodiments of a pre-formed solar panel on a support plane.
Figure 1C:
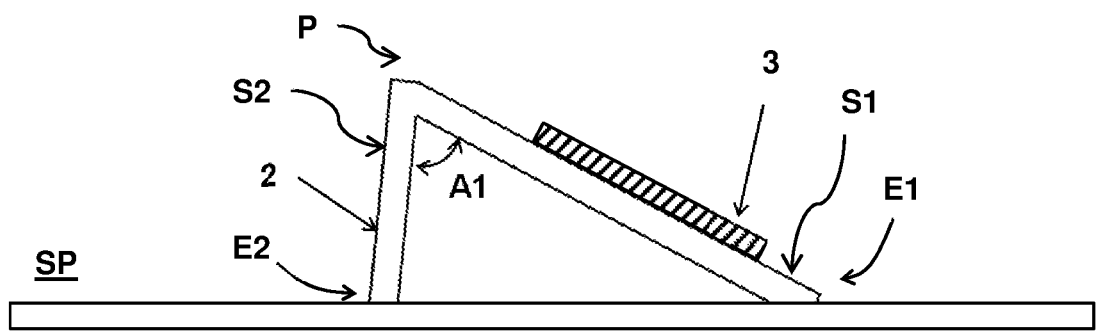

FIG. 1A-C schematically depicts perspective and cross-section side views of an embodiment of a pre-formed solar panel 1 mounted on a support plane "SP". In a preferred embodiment, e.g. as shown, the solar panel is formed with a back panel 2 with, in a direction from a first end E1 to a second opposing end E2, at least a first planar section S1, a plastically deformed section "P" and a second planar section S2. In the embodiment shown, a photovoltaic layer 3 is provided on the second planar section S2. The plastically deformed section maintains the first and the second planar section relative to each other at an enclosed angle "A1" in a range between 30° and 170°, e.g. as shown in FIG. 1B-C. In the embodiment as shown only section S1 is provided with a photovoltaic layer 3. In other or further preferred embodiments both sections may be provided with a photovoltaic layer. By providing both sections with a PV layer the photoelectric energy obtained per unit area of carrier may be increased.

Figure 2A:
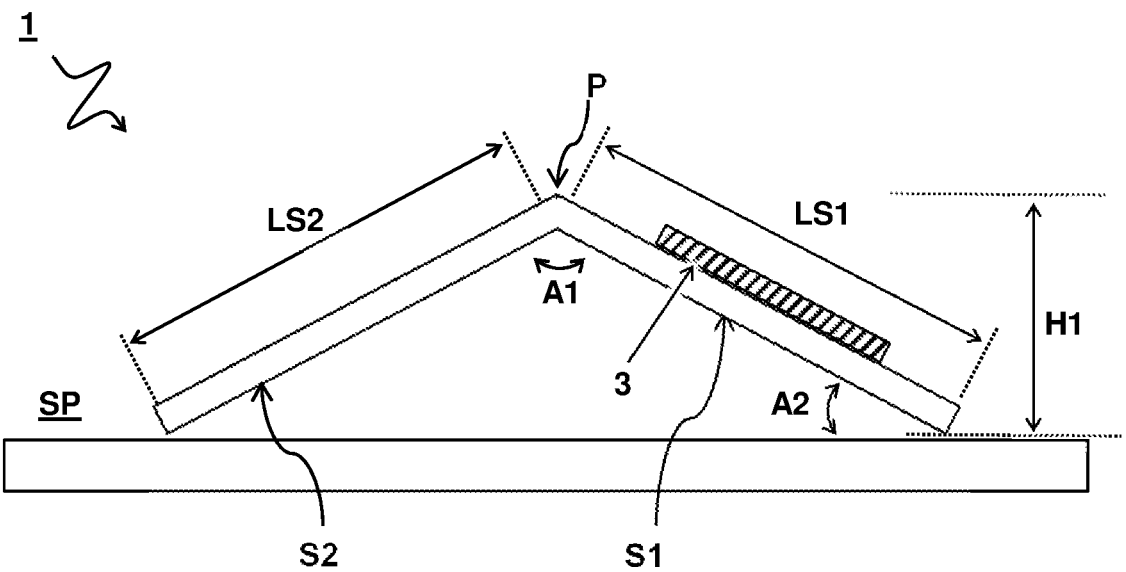
FIG. 2A schematically depicts a cross-section side view of an embodiment of a pre-formed solar panel on a support plane.

FIG. 2A schematically depicts a cross-section side view of an embodiment of a pre-formed solar panel 1 with a height "H1" mounted on a support plane "SP". The length LS1 of the first planar section "S1" and the length LS2 of the second planar section S2 between the plastically deformed section "P" and the respective opposing end of panel are such that, when mounted, an enclosed angle A2 defined between the at least one of the sections with a photovoltaic layer 3 and the support plane "SP" is in a range between 10° and 90°. Providing the pre-formed solar panel 1 with the specified enclosed angle A1 and suitable section lengths LS1, LS2, the photovoltaic layer 3 may, when mounted, be positioned at angle with respect to level, i.e. the astronomical horizon, e.g. at an angle, in a range between 10° and 90°, e.g. 20° or 30°. By mounting the photovoltaic layer under an angle in said range efficient run-off of water, e.g. rain, may be ensured, mitigating fouling and/or reducing build-up of contamination on the photoactive surface of the panel. The height "H1" of the pre-formed solar panel depends on the length LS1, LS2 of the sections and the enclosed angle A1 between the sections. In practice, the length of the sections, the height of the pre-formed solar panel 1, and a dimension of the pre-formed solar panel 1 along the length of the plastically deformed section P may be tuned to the dimension of the carrier and/or to the relative orientation of the carrier. As known in the field, for a East-West orientation an about symmetric pre-formed solar panel 1 with photovoltaic layers on both sections may be preferred. For a North-South orientation symmetrical panels with a comparatively larger angle A1 may be preferred (the photovoltaic layer 3 mounted under a more shallow angle A2 with respect to the horizon. Optionally, asymmetric pre-formed solar panels, having a photovoltaic layer 3 on only one planar section may be used. For such panels the projected area of the section not provided with a photovoltaic layer 3 on the support plane "SP" is preferably minimized while maintaining a suitable angle for the panel with a photovoltaic layer 3. Such panels may be provided with a relatively sharp angle A1 between the sections, e.g. in a range between 30° and 130°, e.g. 60°, preferably in a range between 70° and 110°, e.g. 80° 100°.

In practice, the height H1 of the pre-formed solar panel 1 is preferably selected in a range between 20 and 150 cm, typically in a range between 20 and 100 cm. Lower panels, have comparatively less photoactive surface due to edge and mounting effects. Higher panels have dimensions that reduce ease of handling, e.g. during manufacturing and/or assembly. FIGS. 3A-B, 5A-B, 6A, 7B, 8A-C, and 9A-B (all discussed in more detail later) depict further exemplary embodiments comprising photovoltaic layers 3 on both planar sections, and/or embodiments particularly suitable therefor. FIGS. 1C, and 10A-B (all discussed in more detail later), depict further exemplary embodiments comprising photovoltaic layers 3 on one of the planar sections, and/or embodiments particularly suitable therefor.

Figure 2B:
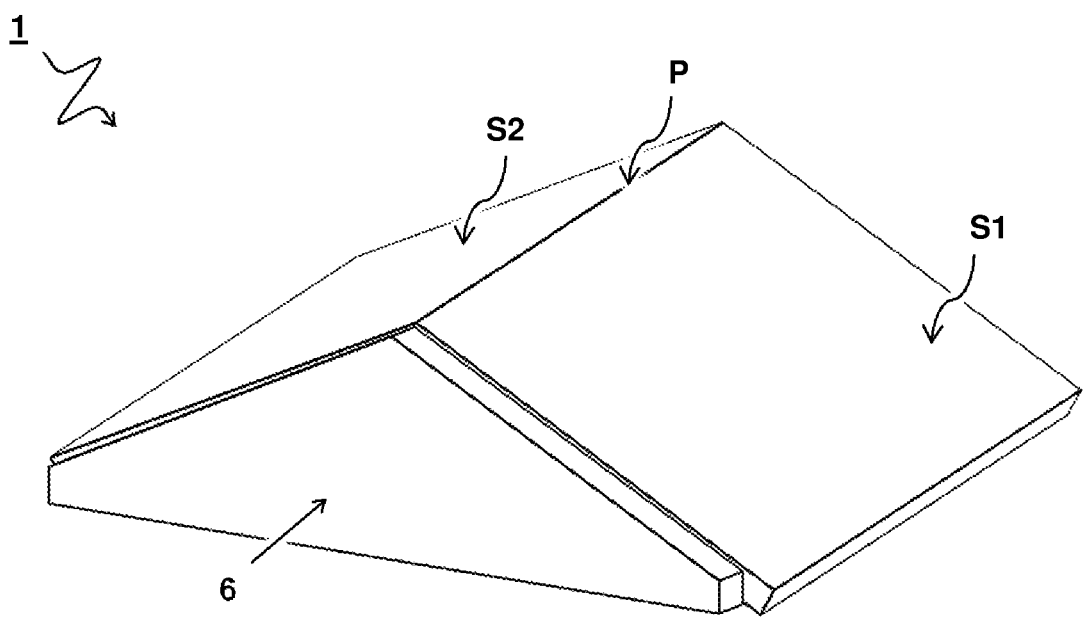
FIG. 2B schematically depicts a perspective view of an embodiment of a pre-formed solar panel with a side-panel.

In another or further preferred embodiment, e.g. as shown in FIG. 2B, the pre-formed solar panel 1 is provided with a side-panel 6 to reduce forces onto a mounted panel due to wind. By reducing the ability of wind to enter the space between the carrier on one hand and the planar sections (S1,S2) on the other hand load, e.g. upward load, and possible resulting damages therefrom are reduced. Said one or more side panel may be affixed to the panel by any suitable means including, but not limited to, bolting and gluing. In a preferred embodiment, the side-panel 6, like the back panel 2, is formed of a composition comprising a thermoplastically deformable material, preferably a polymer. This allows fusing, e.g. welding, of the side-panel 6 to the pre-formed solar panel 1, e.g. by fusing with the back panel 2. It will be appreciated that the side panel may be provided to the pre-formed solar panel 1 before or after the panels are mounted on a carrier. Accordingly, the present disclosure also relates to separate side-panels 6 dimensioned to be affixed to pre-formed solar panels as described herein.

Figure 3A:
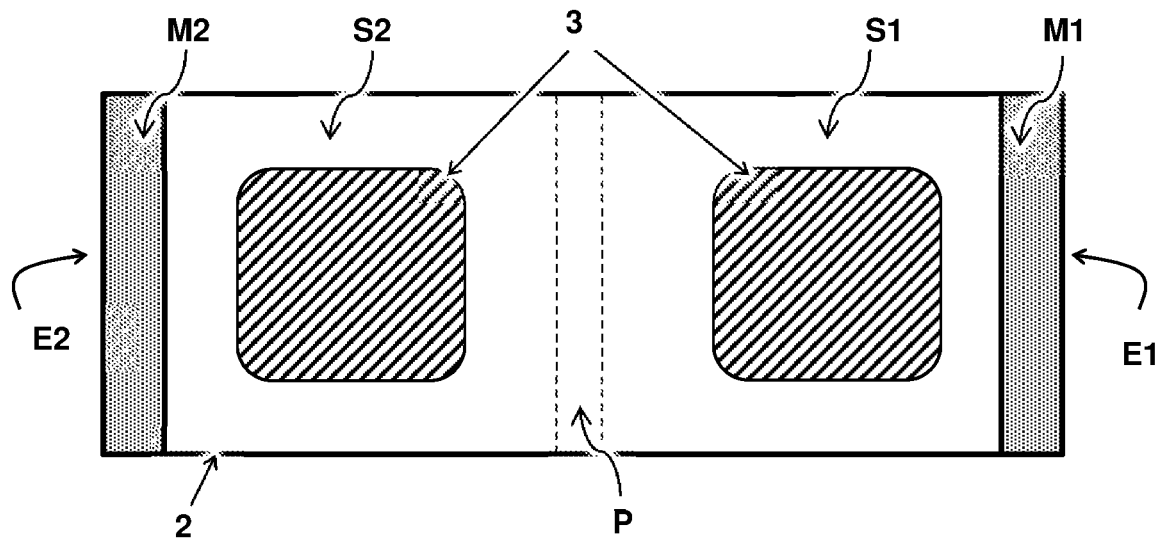
FIG. 3A schematically depicts a top-view of an embodiment of a pre-formed solar panel.
Figure 3B:
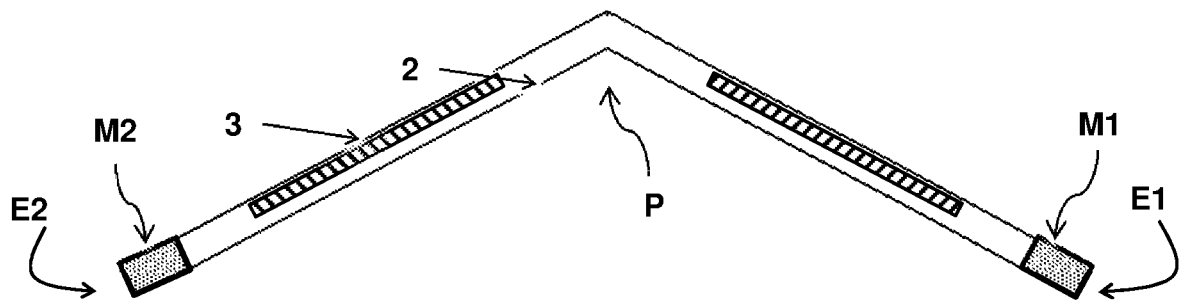
FIG. 3B schematically depicts a cross-section side view of an embodiment of a pre-formed solar panel.
Figure 3C:
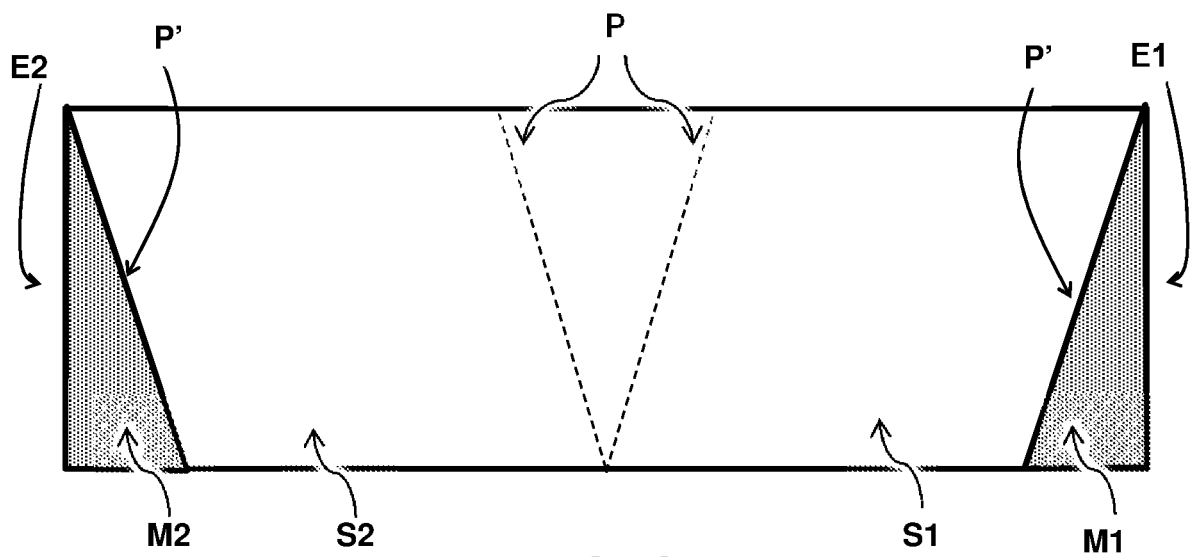
FIG. 3C schematically depicts a detail side view of a mounting region of a pre-formed solar panel FIG. 4A-B schematically depicts a detail in side views of embodiments of pre-formed solar panel FIG. 4C schematically depicts a top-view of an embodiment of a pre-formed solar panel.

FIGS. 3A and B schematically depict top-view and cross-section side view of an embodiment of a pre-formed solar panel 1 that comprises mounting regions M1, M2. In a preferred embodiment, e.g. as shown, the solar panel is formed with a continuous back panel 2 with in a direction from a first end E1 to a second opposing end E2 at least a first planar section S1, a plastically deformed section "P" and a second planar section S2. Onto the both planar sections a photovoltaic layer 3 is provided. The mounting regions are provided along an edge portion of the pre-formed solar panel 1 at positions along opposing ends E1, E2 of the back panel. FIG. 3C schematically depicts a top-view of a further embodiment of a pre-formed solar panel;

It will be appreciated that in some embodiments the mounting regions may simply be formed of end portions of the solar panel and/or its back panel and as such may not be directly identifiable as such. Depending on the indented application, e.g. mounting on a roof, and the availability of mounting means, such as clamps or slots, the panels may be mounted onto the carriers directly by their mounting regions. In other or further embodiment the mounting regions are provided with additional means and/or elements for affixing the panel to a carrier as will be explained in more detail later with reference to FIGS. 9-12. In a preferred embodiment, the mounting regions comprise portions of the back panel along the opposing ends of the back panel that are plastically deformed, e.g. bent, at end portions of the panel and/or its back panel 2, e.g. as shown in FIG. 3C. As such a further plastically deformed region P' may be identifiable between the mounting region and the remainder of the panel.

Figure 4A:
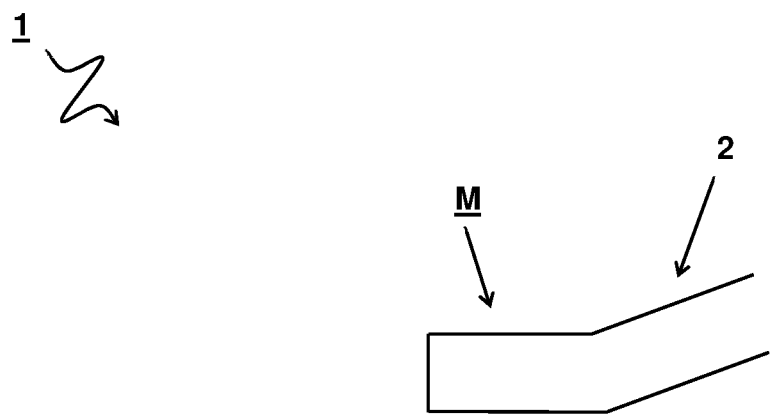
Figure 4B:
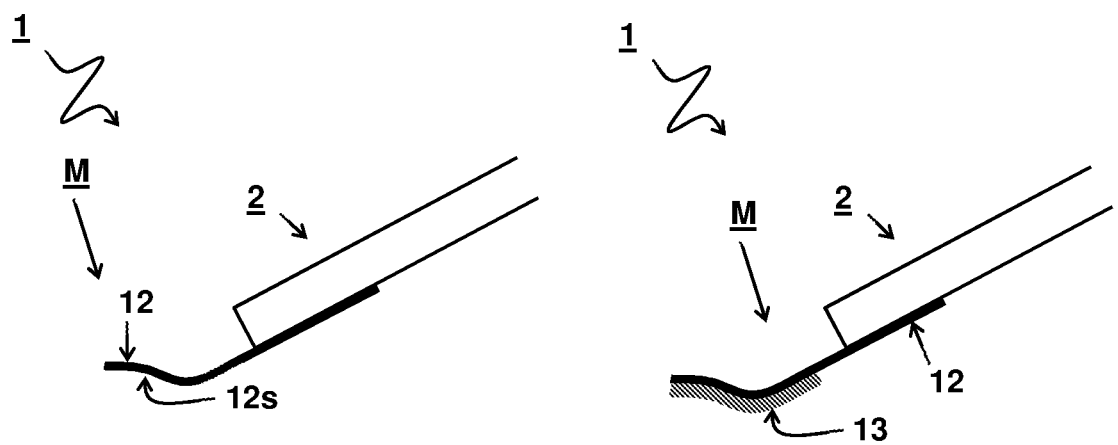
Figure 4C:
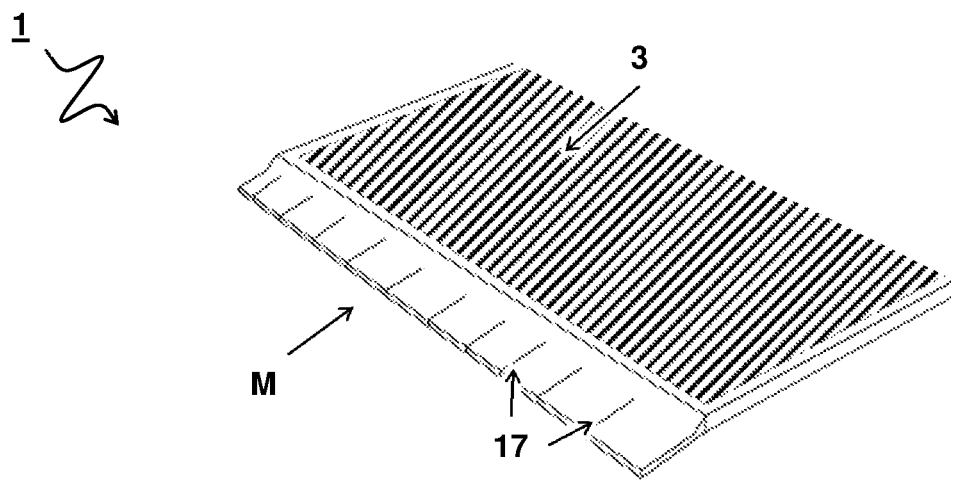

In another or further embodiment, e.g. as shown in FIG. 4B, the mounting region includes a separated mounting element 12 durably attached thereto. Such element may be formed by a separate strip, e.g. band 12 that is durably connected along the edge portion of the solar panel. The strip may have a similar stiffness as the panel. Preferably, the strip is more flexible. For example, the strip may be formed of a cloth, woven, rubbery material. Advantageously, a flexible strip may adapt, e.g. flex, which facilitates affixing the pre-formed solar panel 1 to a surface of an uneven carrier, e.g. a corrugated roof. The strip may be provided with holes or openings to allow affixing the pre-formed solar panel to carriers, e.g. by bolting. Optionally, the strip may be provided with a further means 13, e.g. as shown in FIG. 4B (right) for affixing the panel to a carrier. This means 13 include but are not limited to layer of glue, e.g. bitumen; and loop and hook fastener. The mounting element 12 may be durably attached to the panel, e.g. mounting region by any suitable means known in the field. In a preferred embodiment the mounting element is welded to the panel. Optionally, the mounting element is connected to the panel by a hook and loop fastener (Velcro). In some embodiments, e.g. as shown in FIG. 4B, the mounting regions are provided with cuts or slits 17 extending in a direction away from the edge portion of the pre-formed solar panel. Mounting regions provided with slits or cuts are more flexible and capable of following a surface of an uneven carrier, compared to mounting regions without cuts or slits It will be appreciated that the shape, dimension and relative orientation of the panels including the planar sections and deformed section P and/or the mounting regions are not to be construed as limited to the depicted embodiments. The disclosure also envisions differently shaped panels, in some embodiments, e.g. as shown in FIG. 3C, wherein the plastically deformed section P connecting the planar sections S1, S2 and the plastically deformed section P' between the planar sections and the respective end portions E1,E2 of the panel are provided under an angle with resect to the end portions. In this way panels with PV cells provided on the planar sections may be provided, that when mounted, face other than opposing portions of the sky.

Figure 5A:
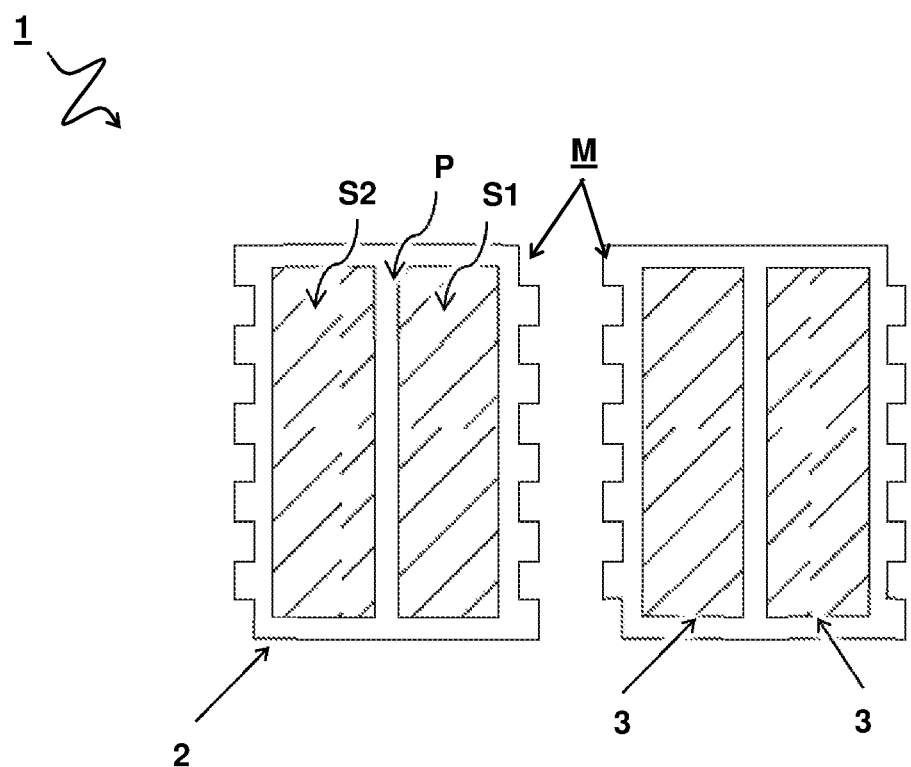
FIG. 5A-B schematically depict a top-views of an embodiment of a pre-formed solar panel.
Figure 5B:
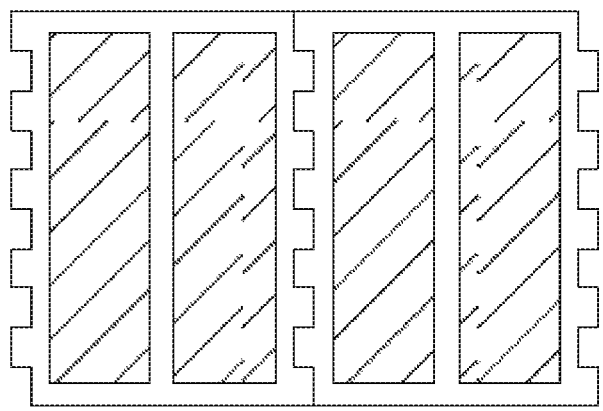

In other or further embodiments, e.g. as shown in FIGS. 5A and B, the mounting regions are formed in a pattern arranged to, when mounted, interlock with a patterned mounting region of an adjacent pre-formed solar panel 1. Alternatively, patterned mounting region may be formed to interlock with a matching separate mounting means.

Figure 6A:
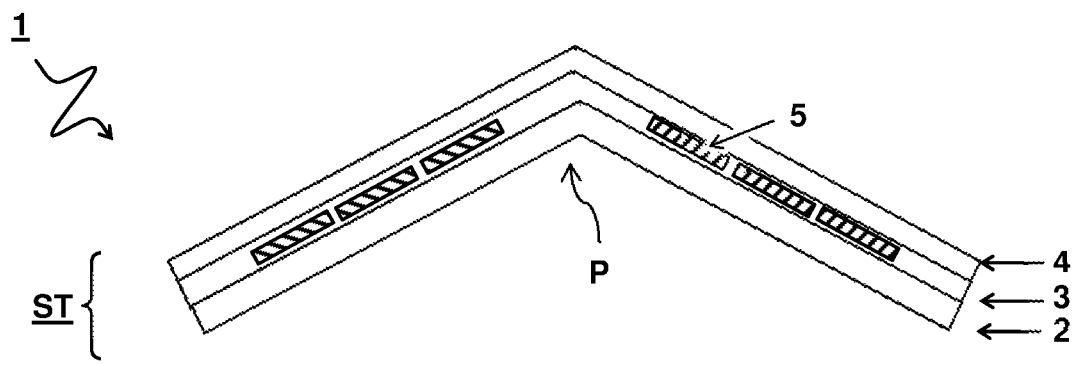
FIG. 6A schematically depicts a cross-section side view of an embodiment of a pre-formed solar panel.
Figure 6B:
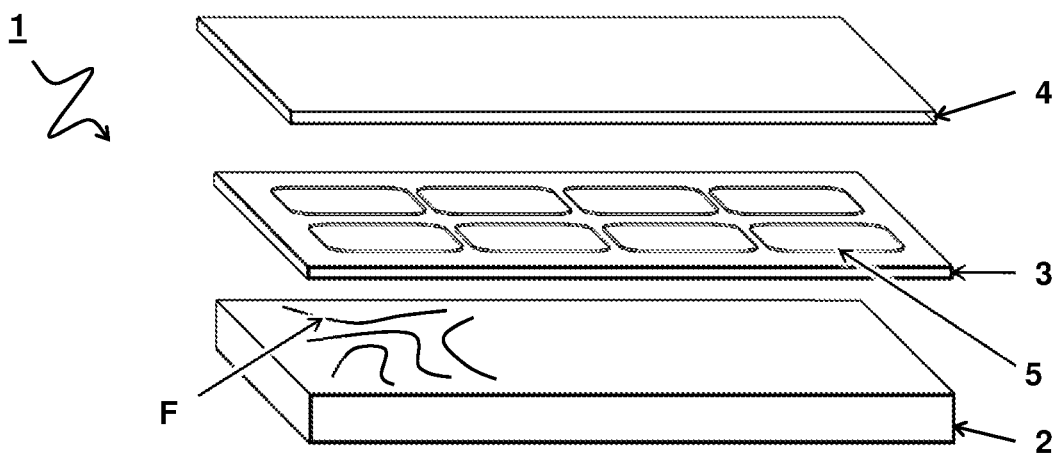
FIG. 6B schematically depicts an exploded perspective view of an embodiment of a pre-formed solar panel.
Figure 6C:
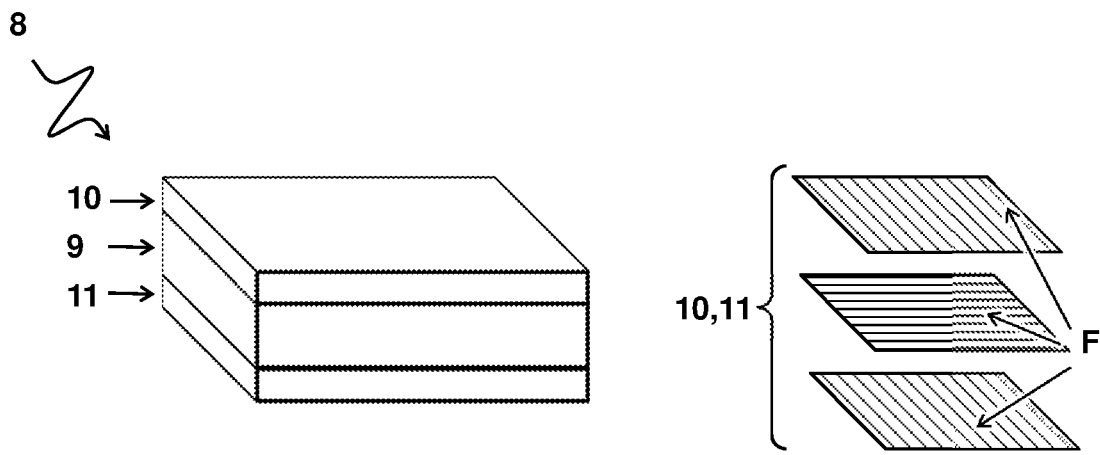
FIG. 6C schematically depicts a perspective view of an embodiment of a sandwich panel comprising a core layer sandwiched between fiber reinforced front and back sheets.
Figure 7A:
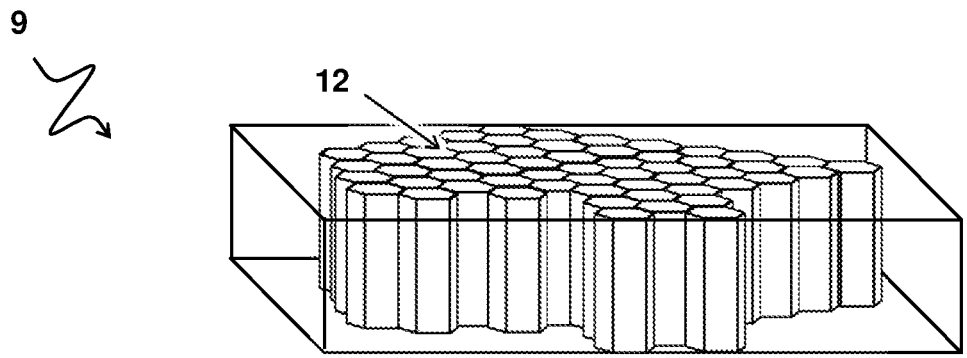
FIG. 7A schematically depicts a perspective view of an embodiment of a core layer.
Figure 7B:
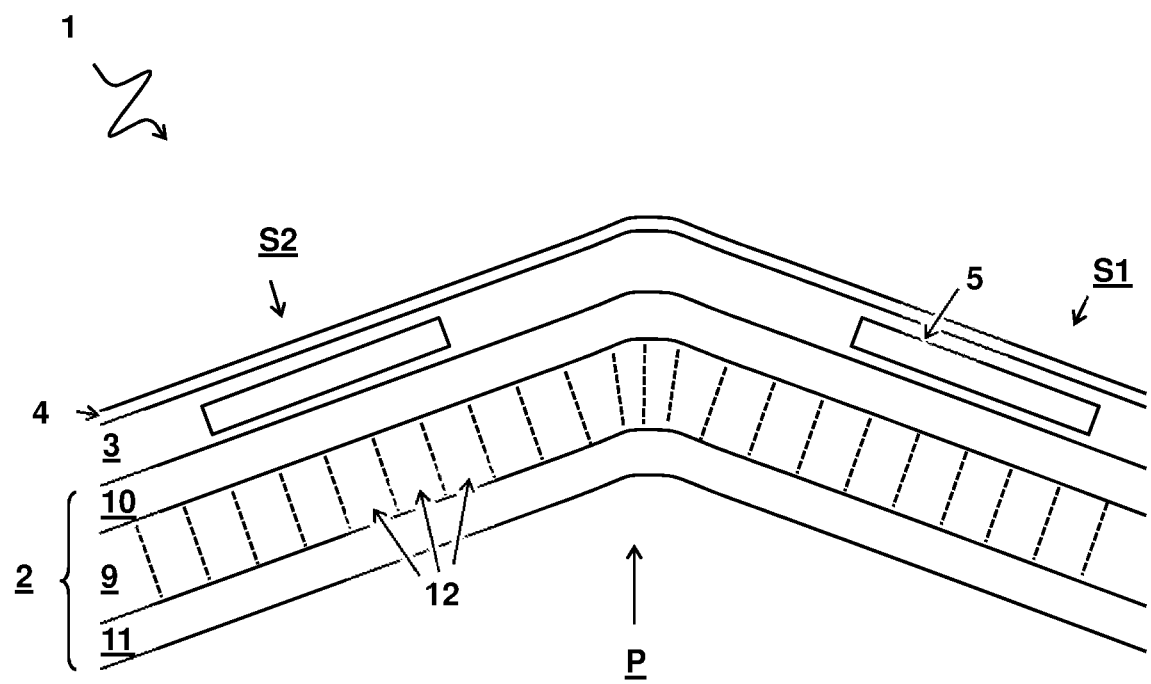
FIG. 7B schematically depict detail cross-section side view of an embodiment around a plastically deformed section regions of an embodiment of a pre-formed solar panel.

Now with reference to FIG. 6A-C and FIG. 7A-B a preferred embodiment of the pre-formed solar panel 1 will be described. As shown in FIG. 6A and in an earlier application by the same inventors with number NL-2022468, which is hereby incorporated by reference, the pre-formed solar panel 1 is preferably formed of a stack ST comprising the photovoltaic layer 3 sandwiched between a back panel 2 and a protective front layer 4. Preferably, the photovoltaic layer 3 comprises a plurality of encapsulated photovoltaic cells 5, e.g crystalline Si PV cells. Preferably, the protective front layer is formed from a compound comprising a first thermoplastic polymer. The back panel is also formed of a composition comprising a second thermoplastic polymer. Advantageously such flat versions of such panels, e.g. without plastically deformed region P, may be manufactured in a efficient process using one or more lamination steps. Using a thermoforming process the flat panels may be thermoformed to form the pre-formed solar panels as described herein. It will be appreciated that, as explained hereinabove, the PV cells 5 are preferably laid-out in a pattern such that cells and/or electrical interconnects are not provided at the region of the plastically deformed section P. In other words, the plastically deformed section P is preferably provided between the photovoltaic cells 5. The back panel 2 is preferably a fiber F reinforced panel. The reinforced back panel is a compound material comprising a second thermoplastic polymer and a reinforcement material, preferably a fibrous reinforcement material F. In other or further preferred embodiments the back panel is a sandwich panel 8 comprising a core layer 9 sandwiched between fiber reinforced front and back sheets 10,11. In turn, the fiber reinforced front and back sheets 10,11 may be a multi-layered composites, e.g. fiber reinforced tape layers stacked in a cross-ply orientation. In some embodiments, the core layer 9 may be a dense layer, e.g. a solid layer of a thermoplastic polymer composition. In some preferred embodiments the core is a honey comb panel 12, e.g. as shown in FIG. 7A, wherein the honey comb panel is formed of a thermoplastically deformable polymer composition. By using a honey comb panel the back panel, including the fiber reinforced front and back sheets may be provided with the desired strength. By forming the back sheet from thermoplastically deformable materials, backsheets may be thermoformed into a desired position to form a pre-formed solar panel 1 as described herein. FIG. 7B is a cross-section side-view that depicts a detail of a photovoltaic sandwich panel comprising a photovoltaic layer 3 provided between a protective front layer 4, and a fiber reinforced back layer 2, wherein the fiber reinforced back layer is a sandwich panel comprising a honey comb core layer 9 sandwiched between a fiber reinforced thermoplastic top layer 10 and a fiber reinforced thermoplastic polymer bottom layer 11. Upon locally heating the panel above a softening point of the respective layers the panel is formed, e.g. bent, to form a pre-formed solar panel 1, with an enclosed angle A1 as specified herein.

As described above, the height H1 of the pre-formed solar panel 1 depends on the length LS1, LS2 of the sections S1,S2 and the angle between them. In practice the height preferably varies in a range between 20 and 150 cm. In some preferred embodiments the lengths LS1, LS2 of the sections S1,S2 between the plastically deformed section P and the respective opposing end of back panel 2 are in a range to define a height of the pre-formed solar panel, in a range between 20 and 80 cm, preferably in a range between 30 and 50 cm. Lower pre-formed solar panels and assemblies thereof are advantageous for being less susceptible to wind loads.

Figure 8A:
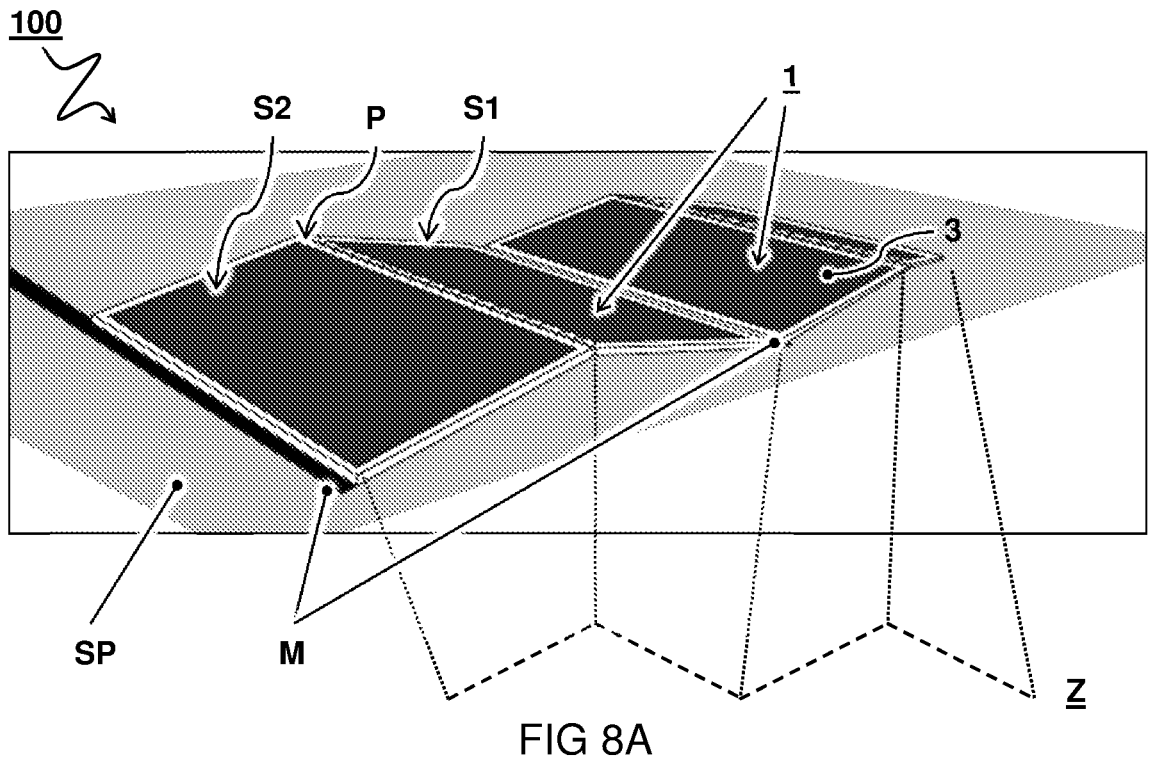
FIG. 8A schematically depicts a perspective view of an embodiment of an assembly of a plurality of pre-formed solar panels on a support plane.
Figure 8B:
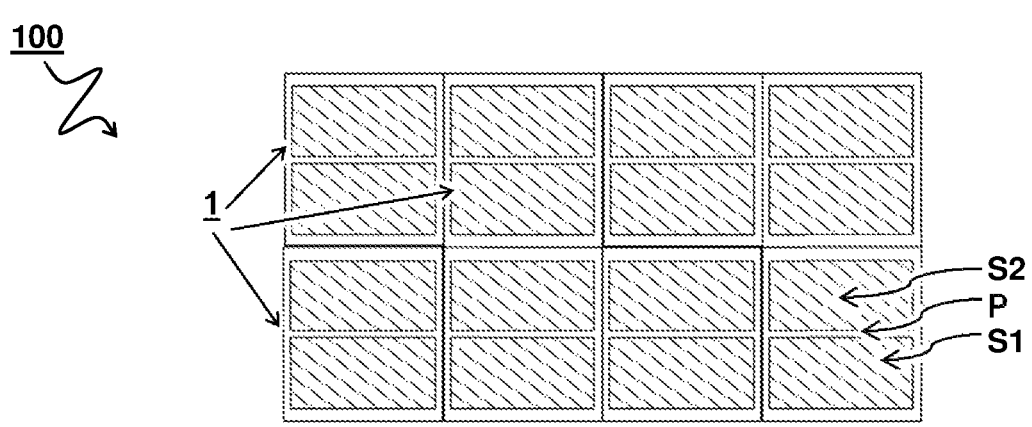
FIG. 8B-C schematically depicts top-views of embodiments of an assembly of a plurality of pre-formed solar panels.
Figure 8C:
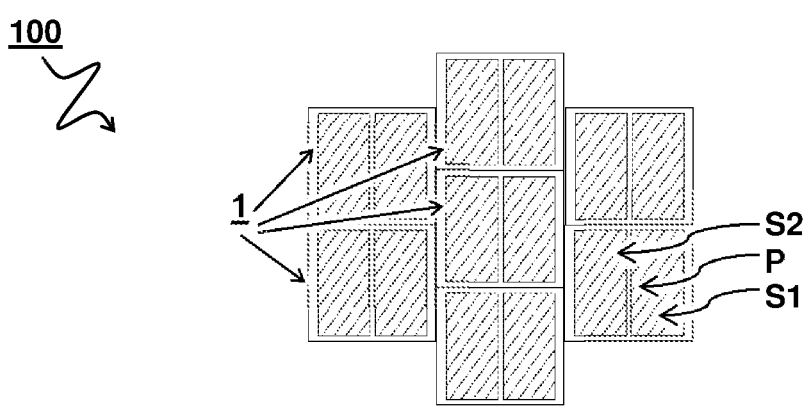

FIG. 8A schematically depicts a perspective view of an embodiment of an assembly 100 of a plurality of pre-formed solar 1 panels on a support plane SP of a carrier. The support plane may be understood to be a surface of any suitable carrier including, but not limited to a roof (flat roof, slanted roof); a wall; a field; or any other support structure for a PV installation (e.g. poles). FIGS. 8B-C schematically depict top-views of embodiments of an assembly 100 of a plurality of pre-formed solar panels 1. As described above, the pre-formed solar panels 1 described herein may be used to assemble a photoelectric energy harvesting installation 100 on a carrier wherein the planar section S1, S2, including photoactive regions 3 are oriented in a so-called zig-zag "Z" orientation, e.g. as shown in FIG. 8A. By using the pre-formed solar panels according to the invention, e.g. without using a dedicated mounting frame, the installation time and/or costs to form such assembly may be reduced. By orienting the panels in a zig-zag orientation the total number of panels per unit area of carrier may be increased, thus increasing attainable photoelectric output on a given carrier, e.g. a rooftop with limited total surface area. In a preferred embodiment adjacent pre-formed solar panels 1 are durably joined, e.g. fused, to form a continuous structure shielding the carrier at locations below the continuous structure from water. Adjacent panels may be joined to form an array with a simple pattern of rows and columns, e.g. as in FIG. 8B. Spaces, i.e. mounting regions M1, M2, between adjacent panels may be sufficiently wide for a person to walk on, e.g. during installation and/or maintenance. In a preferred embodiment, the panels many be joined in an array formed of staggered rows, e.g. as in FIG. 8C. Independently, of the lay-out of the array pre-formed panels, e.g. at the end or beginning of a row may be provided with a side-panel 6 as described above.

Figure 9A:
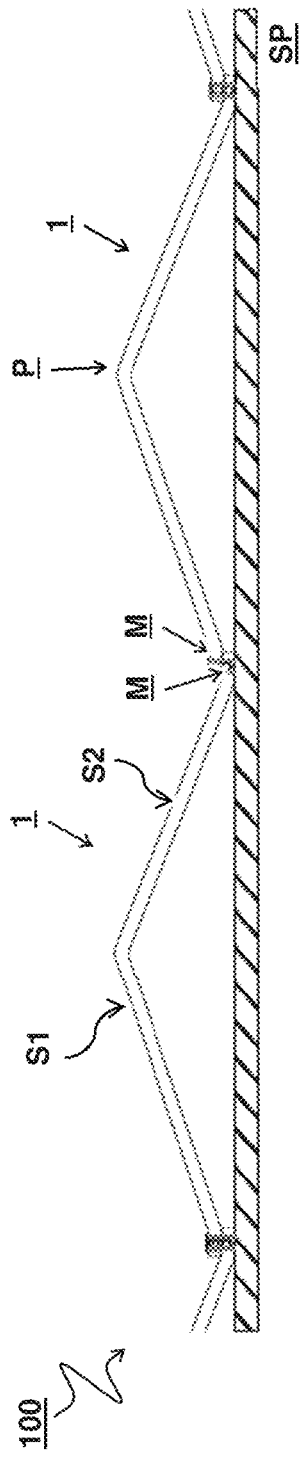
FIG. 9A-B schematically depict cross-section side views of embodiments of pre-formed solar panels assembled on a support plane.
Figure 9B:
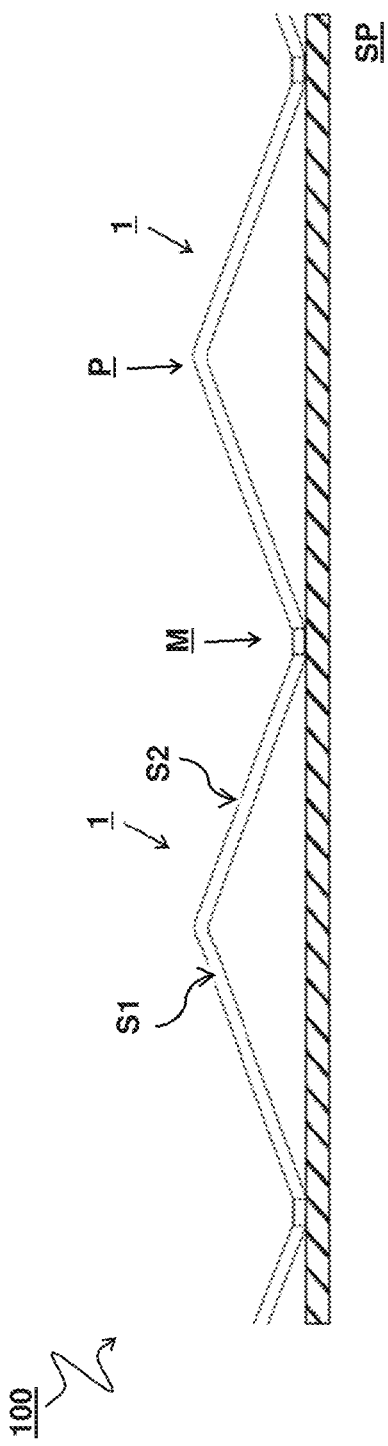
Figure 10A:
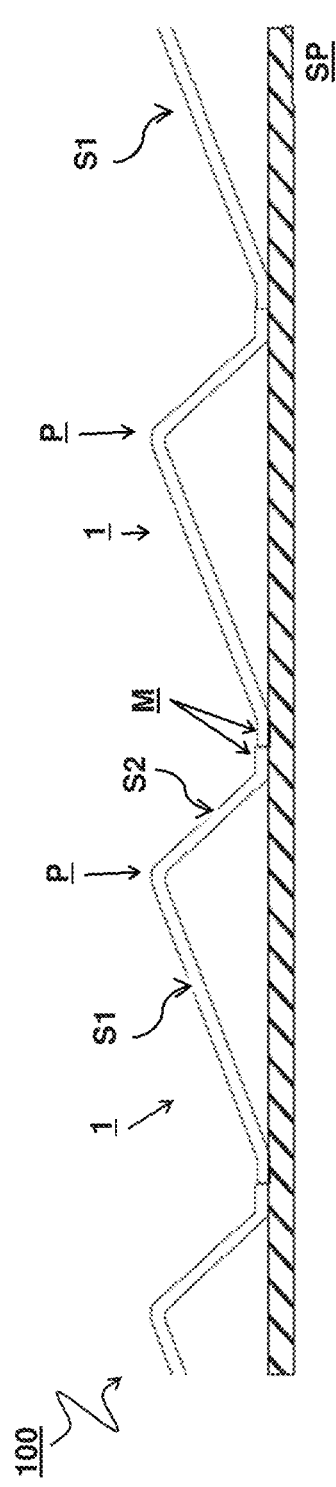
FIG. 10A-B schematically depict cross-section side views of further embodiments of pre-formed solar panels assembled on a support plane.
Figure 10B:
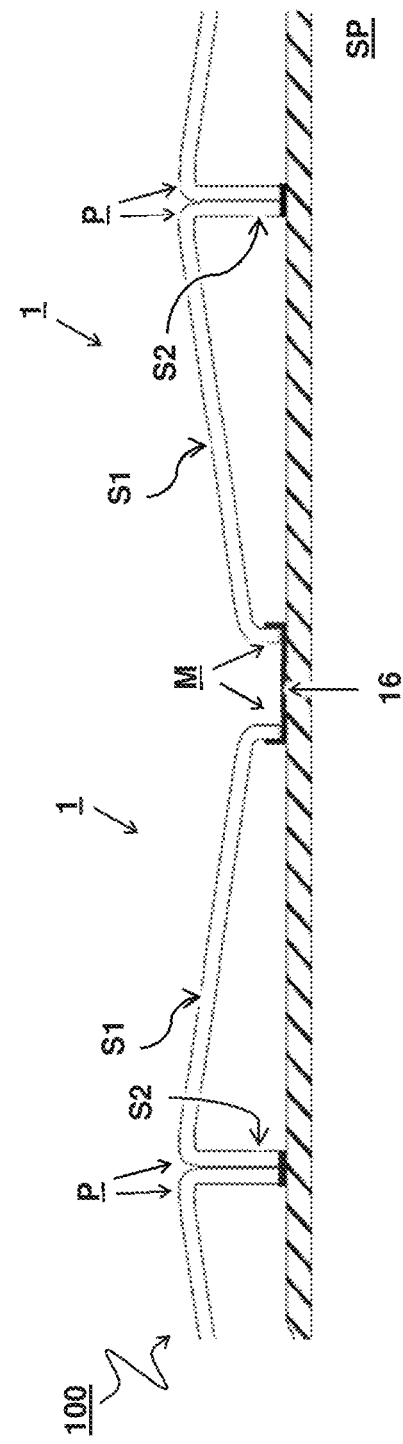
Figure 11A:
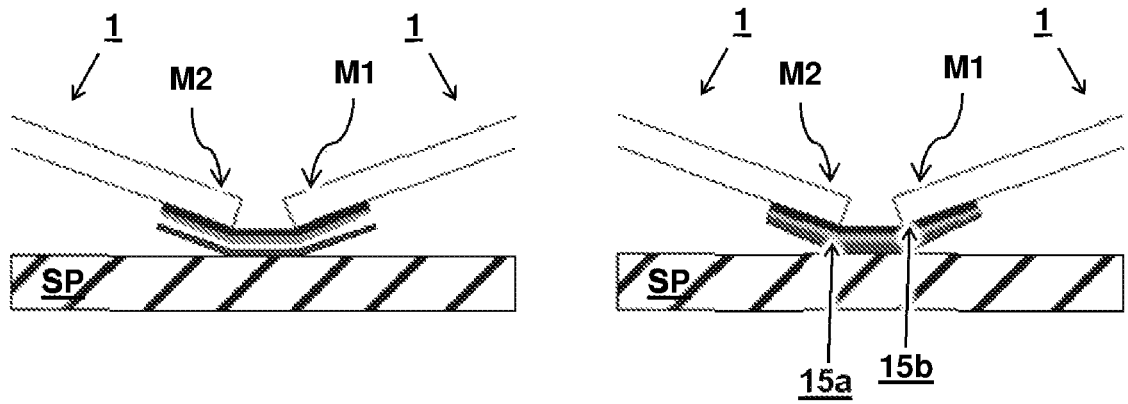
FIG. 11-12 schematically depict detail cross-section side views of the mounting regions of embodiments of pre-formed solar panels assembled on a support plane.
Figure 11B:
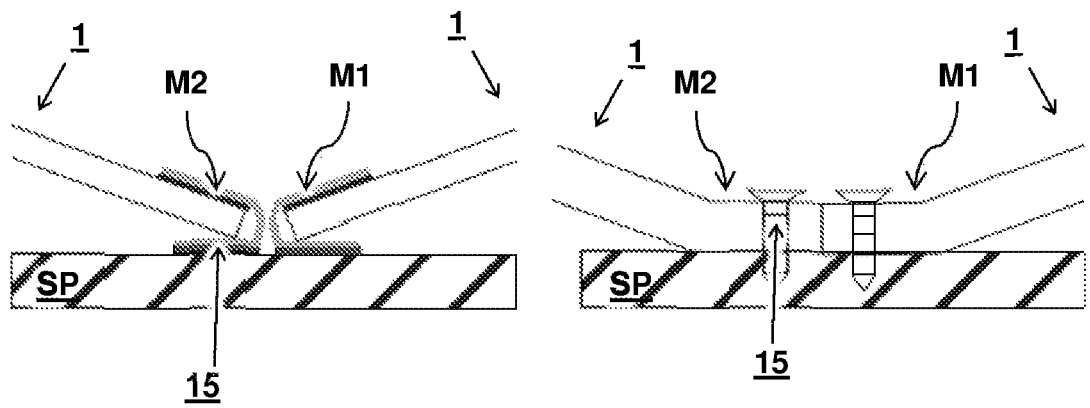
Figure 11C:
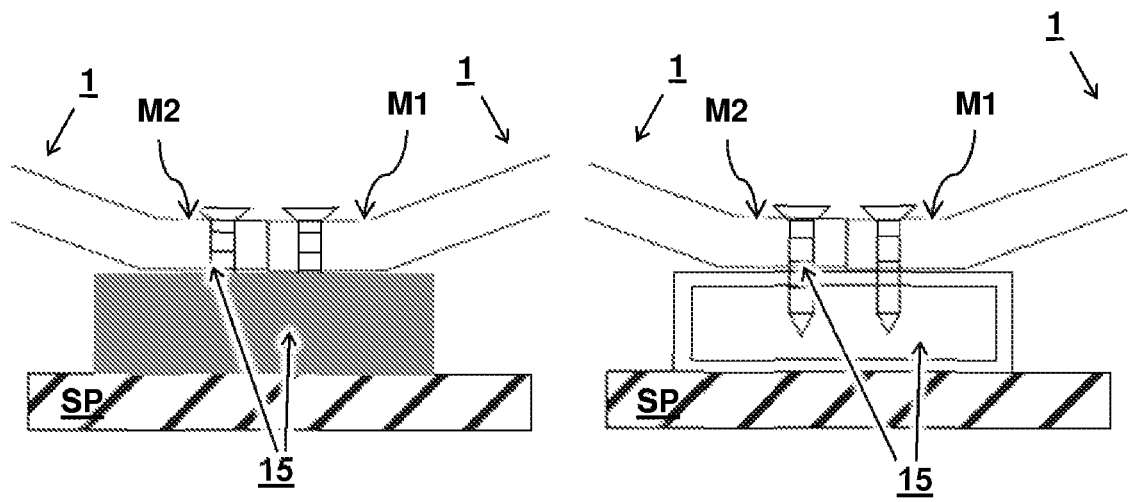

FIGS. 9 and 10 schematically depict cross section side views of exemplary embodiments of assemblies 100 of pre-formed solar panels 1 on a support plane "SP". In FIGS. 9A-B the panels 1 comprised in the assembly are approximately symmetric and the first and second planar sections S1,S2 are of about equal length. It will be appreciated that in such assemblies either section, preferably both sections may be provided with a photovoltaic layer 3. The first and second planar sections S1,S2 in the exemplary embodiments depicted in FIG. 10A-B are dimensioned as an asymmetric panel in which preferably only one of sections is provided with a photovoltaic layer 3.

FIGS. 9-12 further depict a broad range of exemplary embodiments of differently shaped and/or dimensioned mounting regions M, mounting elements 12, and/or mounting means 13. In one embodiment, adjacent panels may be joined with an overlap, e.g. with overlapping mounting regions, e.g. as shown in FIGS. 9A, 12A, and 12C. In another or further embodiments adjacent panels may be joined with touching edge portions, e.g. as shown in FIGS. 10A, and 12B. Joining may be understood to include gluing and welding. By mounting adjacent panels in a partly overlapping fashion and/or by joining panels an assembly 100 with improved overall integrity may be attained as in such assemblies individual panels impart strength from adjacent panels. Further, mounting adjacent panels in a partly overlapping fashion and/or by joining panels may result in the formation of a watertight assembly which in it self, or in part, may be used to cover an opening in, for example, a building. In other words, the pre-formed solar panel 1 of the invention may advantageously be used as a construction panel. Simply mounting the panels in adjacent positions, e.g. as shown FIG. 11B is also envisioned but may not lead to the formation of a watertight assembly. Optionally, adjacent panels may be joined before or after mounting, either directly, e.g. by welding edges of adjacent back panels directly together of, alternatively via an strip 12, 12a, e.g. as shown in FIGS. 9B, 10B and 11A. The strip may be affixed to the mounting surface and may serve as gutter to drain off excess water, e.g. rain, from the assembly 100. Further optionally the panels may be mounted on a carrier rail 16. Affixation may be obtained by means 13 described herein and/or means known in the field. These include, but are not limited to, screwing, nailing, bolting and the like, as shown in FIG. 9A, FIGS. 11B (right), 11C, and 12C. These further include hook-and-loop fasteners (Velcro) and the like, e.g. as shown FIG. 11A, 11B (left) as wells as push buttons and glue, such as bitumen, e.g. as shown in FIGS. 11A and 12A.

A further aspect of the present disclosure relates to methods for the manufacturing of a pre-formed solar panel, preferably a pre-formed solar panel as described herein. A method for manufacturing a pre-formed solar panel as described herein comprises:

providing a thermoplastically deformable back panel (2)

plastically deforming, preferably thermoplastically deforming a section (P) of the back panel (2) to form at least a first and second planar sections (S1,S2) separated by the plastically deformed section (P), and wherein the plastically deformed section maintains the first and the second planar section relative to each other at an enclosed angle (A1) in a range between 30° and 170°. The photovoltaic layer 3 may be provided before or after setting the angle between the sections. Preferably, the method comprises providing a planar thermoplastically deformable solar panel, as described above with reference to FIGS. 6 and 7.

A further method for manufacturing a pre-formed solar panel (1) as described herein comprises:

providing at least a first and second planar solar panels each comprising a thermoplastically deformable back panel (2), e.g. planar thermoplastically deformable solar panels, as described above with reference to FIGS. 6 and 7.

contacting under a pre-defined angle, optionally via a strip of a thermoplastically deformable material, and heating edge portions of the thermoplastically deformable back panels of first and second planar solar panels and optionally the strip of a thermoplastically deformable material, for a time and temperature suitable to fuse the panels along a plastically deformed section (P) to form the pre-formed solar panel comprising at least a first and second planar sections (S1,S2) separated by the plastically deformed section (P), and wherein the plastically deformed section maintains the first and the second planar sections relative to each other at an enclosed angle (A1) in a range between 30° and 170°.

It will be appreciated that thermoplastic deformation, e.g. bending, may include heating to a temperature above a softening point of the panel. Pressure applied to the softened panel(s) to position the planar sections under a desired angle. Positioned panels and or panel sections are cooled back to a temperature below the softening point to durably fix the sections under the set angle.

Figure 12A:
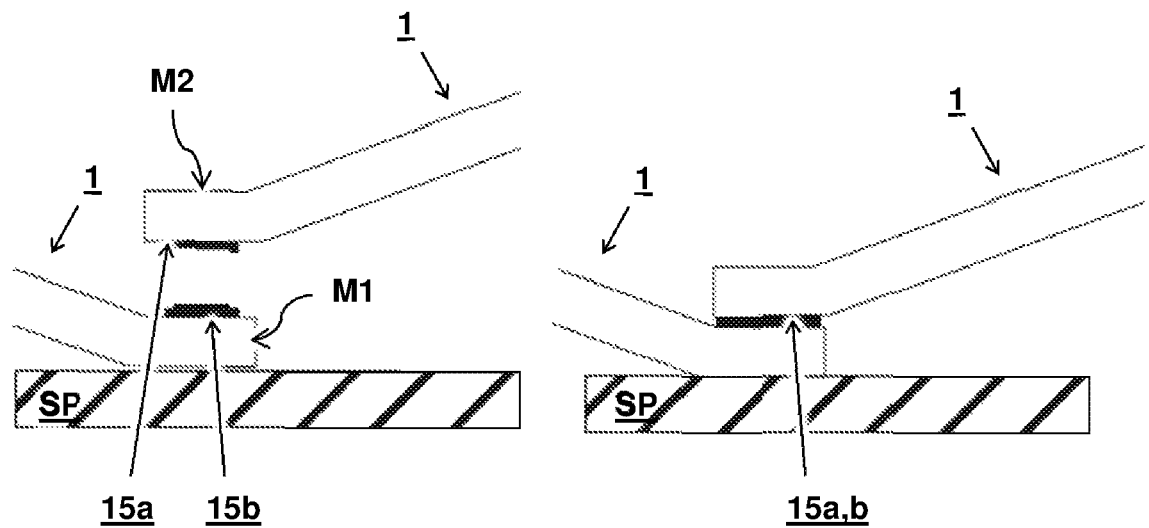
Figure 12B:
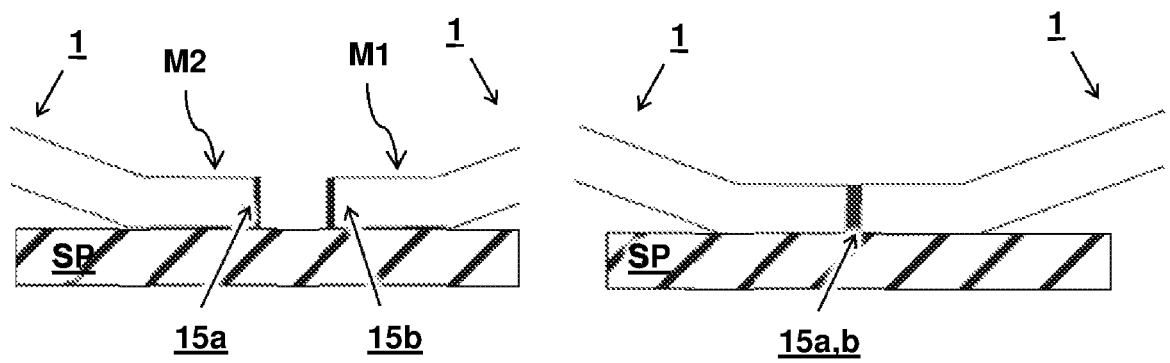
Figure 12C:
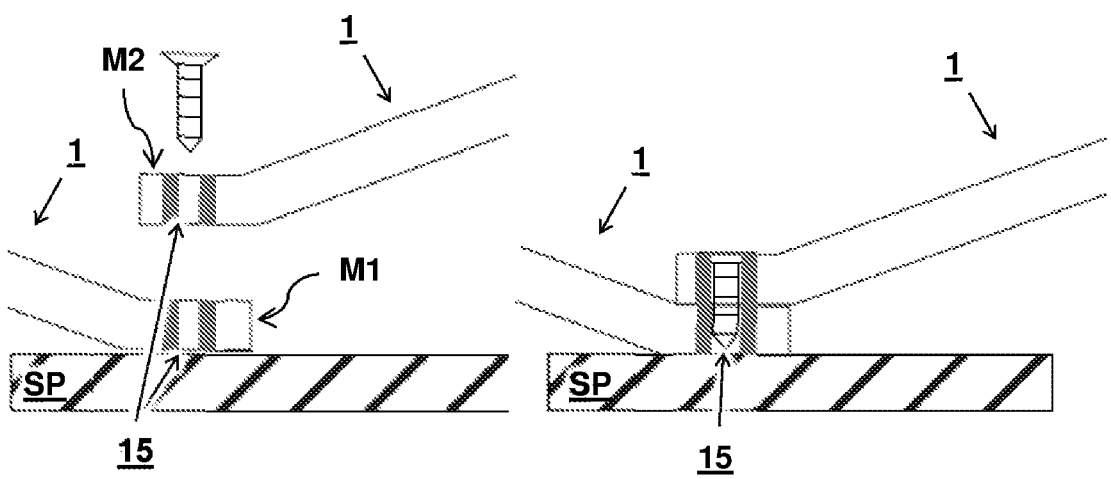
Figure 12G:
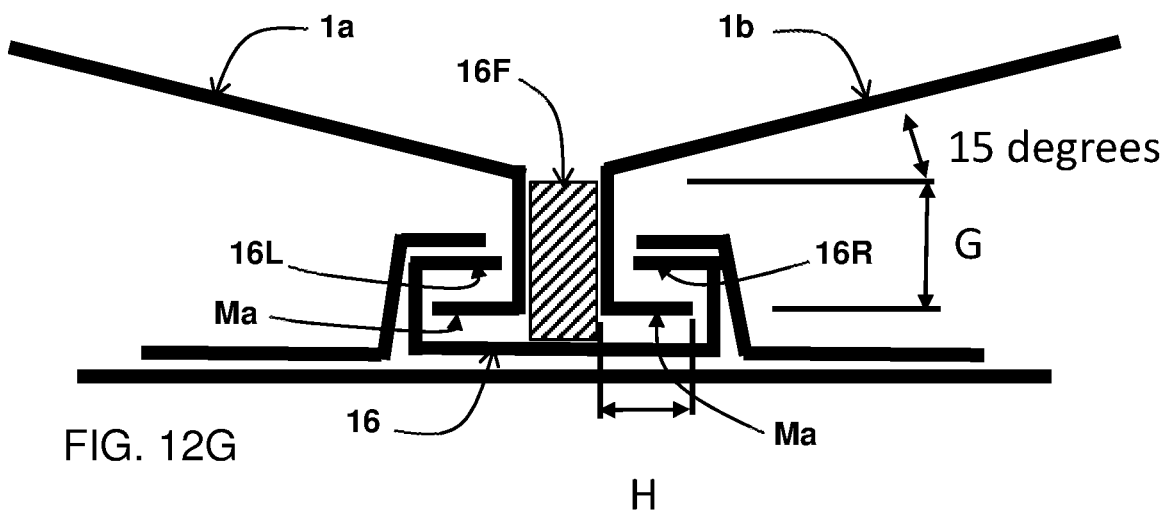
Figure 12H:
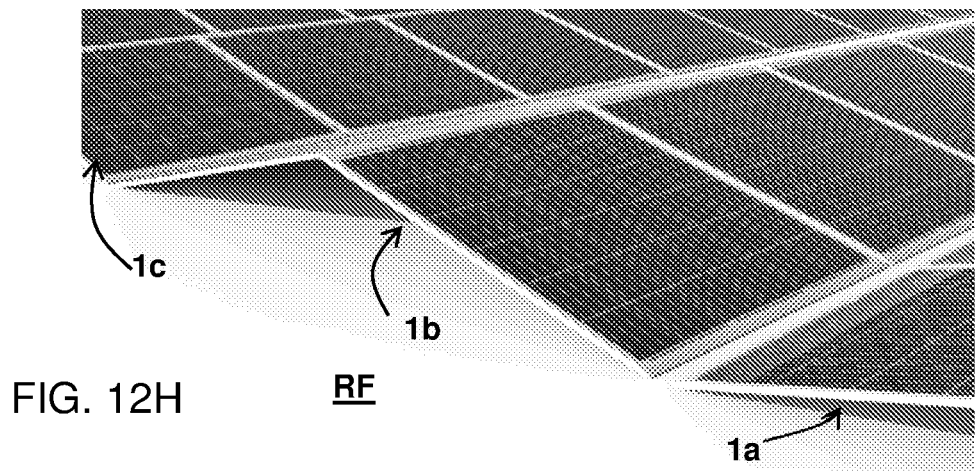

FIG. 12D, 12E, 12F, schematically shows two preformed solar panels 1a, 1b of an assembly that are fixed to each other and to the roof using a rail 16. As shown in more detail in FIG. 12F and also in FIG. 14B, the rail 16 has at least one, in this case two inwardly pointing edges 16L, 16R. The mounting sections Ma, Mb of the pre-formed solar panels 1a, 1b have a backwardly curved edge that cooperates with the inwardly pointing edge (See the detail in FIG. 12E for panel 1b). In the embodiment shown in FIGS. 12F and 14B, the backwardly curved edge of the mounting section Ma, Mb is clamped against the inwardly pointing edge of the rail with a filling piece 16F mounted in the rail 16. FIG. 12G shows the cross-section of FIG. 12F in still further detail. Solar panels 12a, 12b, 12c etc may be assembled on a roof therewith, as shown in FIG. 12H. In the example shown, the solar panels are arranged at an angle of about 15 degrees, therewith the efficiency of the panels is relatively insensitive to the angle of incident solar radiation.

FIG. 13A-13I shows an embodiment of a method of assembling pre-formed solar panels 1a, 1b on a roof RF. FIG. 13A-13D shows how a strip, e.g. having a width of about 5 to 15 cm, e.g. of about 10 cm, of a first Velcro component F1 is rolled over the surface of the roof and adhered therewith. In an embodiment, this first component F1 may be comprised in the roof membrane (e.g. from bitumen, PVC, EVA, EPDM) already.

Figure 13A:
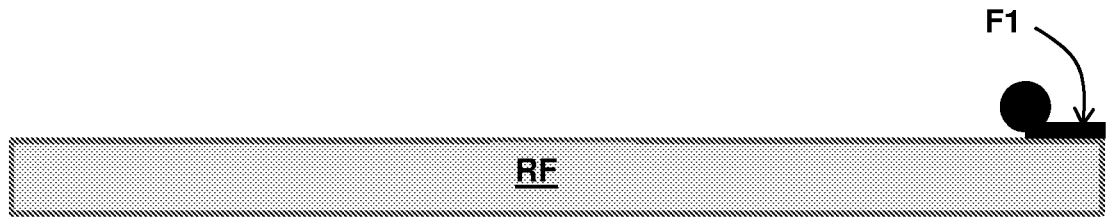
FIG. 13A-13I shows a method of mounting a plurality of solar panels on a roof.
Figure 13B:
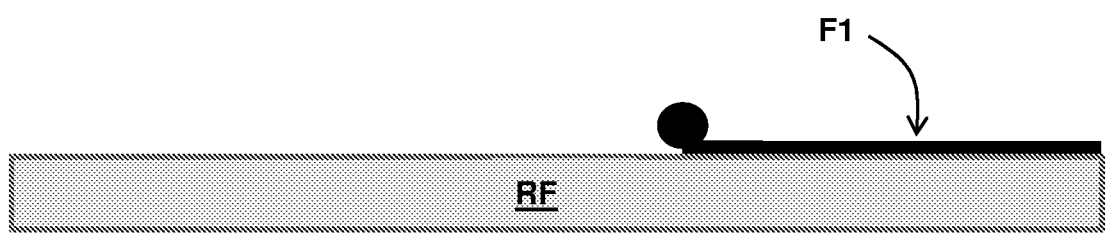
Figure 13C:
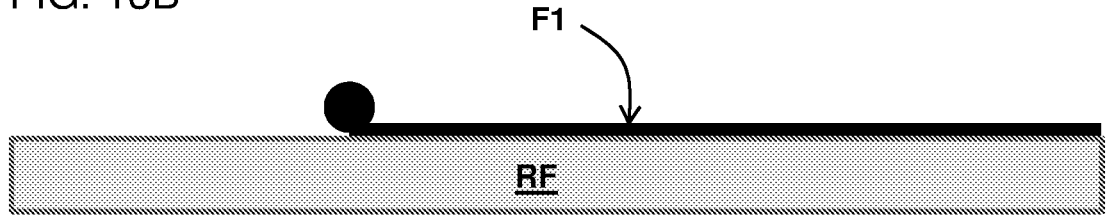
Figure 13D:
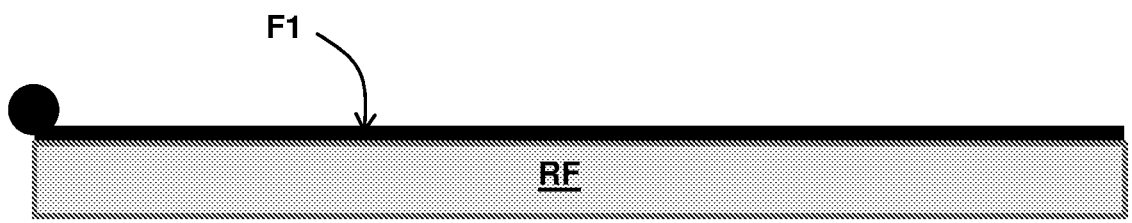
Figure 13E:
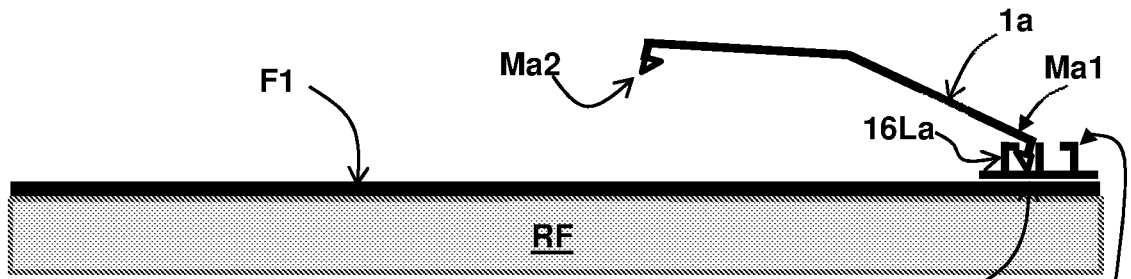

In a subsequent stage rails 16a, 16b, . . . etc having a bottom surface with the complementary Velcro component are attached to the first Velcro component. Preferably the first Velcro component comprises loops and the second component F2 comprises hooks. FIG. 13E shows a first assembly stage, wherein rail 16a is attached with a layer of the second Velcro component F2 to the first Velcro component F1 on the surface of the roof RF an wherein a first preformed solar panel 1a is hooked with its mounting section Ma1 behind the inwardly pointing edge 16La of the rail 16a. Instead of a rail, which extends over the full length of the panel, alternatively a bracket may be used having a dimension along the Velcro component in the order of about 10 to 30 cm, depending on an expected wind load, and having a dimension transverse thereto corresponding to the width of the Velcro component.

Figure 13F:
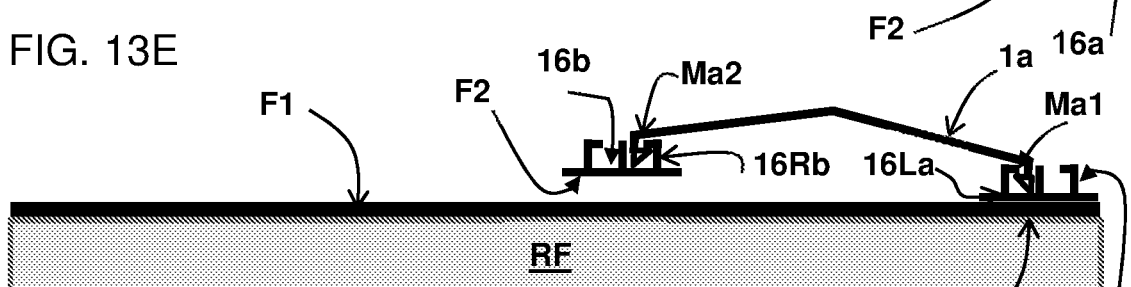
Figure 13G:
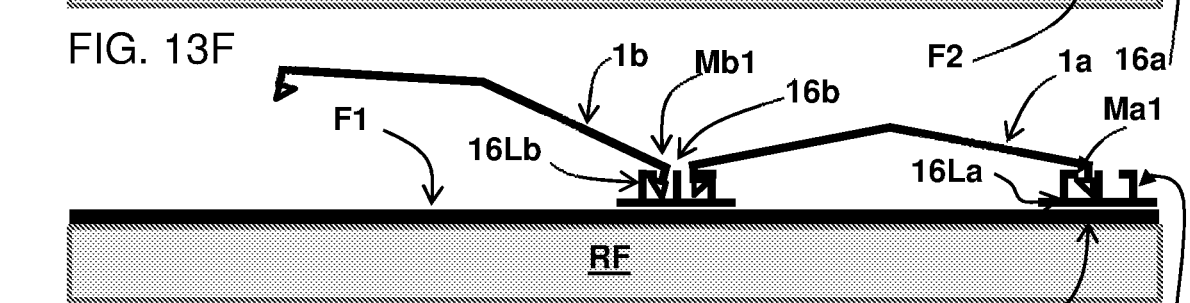
Figure 13H:
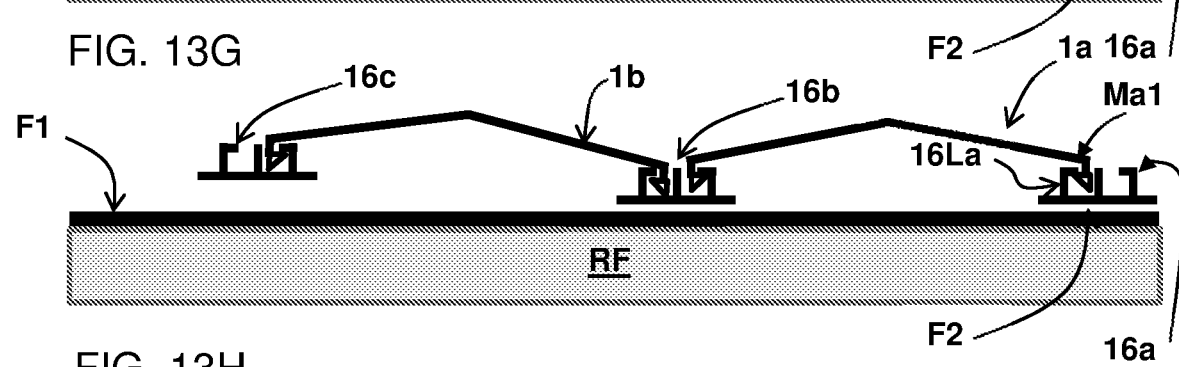
Figure 13I:
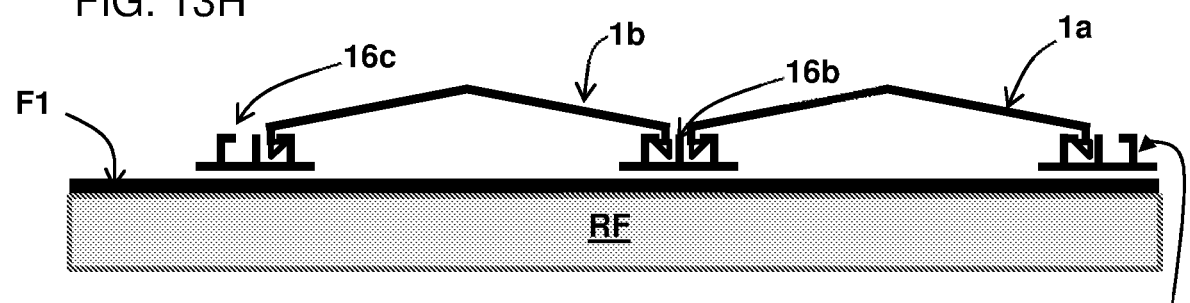

FIG. 13F shows a second stage, wherein the opposite mounting section Mat of the first preformed solar panel 1a is hooked behind backwardly curved edge 16Rb of a next rail 16b. The rail 1 Gb is subsequently attached with its the second Velcro component F2 to the surface of the roof RF, as shown in FIG. 13G. As also shown in FIG. 13G, a next preformed solar panel 1b is hooked with its mounting section Mb1 behind the inwardly pointing edge 16Lb of the rail 16b. As shown in FIG. 13H, 13I, the preformed solar panel may mounted to a further rail 16c in the same way as shown in FIG. 13F, 13G for the preformed solar panel 1a. It is noted that in some embodiments, the rails 16a, 1 Gb, 16c etc may first be mounted to the surface of the roof RF, before coupling the preformed solar panel 1a, 1b, etc, . . . thereto. For that purpose, either the mounting regions of the preformed solar panels, or the backwardly curved edges of the rails or both may be of an elastic material. The method described with reference to FIG. 13A-13I allows a very efficient assembly process. Alternatively however, assembly elements, such as rails or brackets may be fixed in other manners to a roof, e.g. by adhering, or fixed by a screw connection.

Figure 14A:
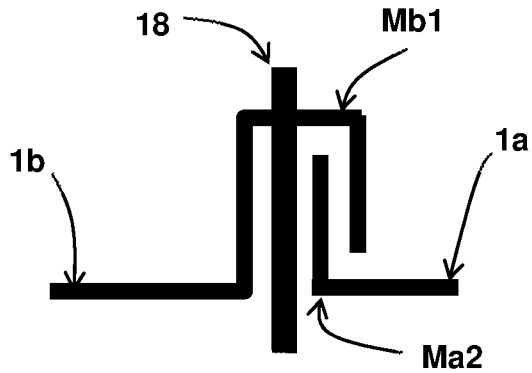
FIG. 14A, 14B shows examples of solar panels having mutually cooperating mounting regions.
Figure 14B:
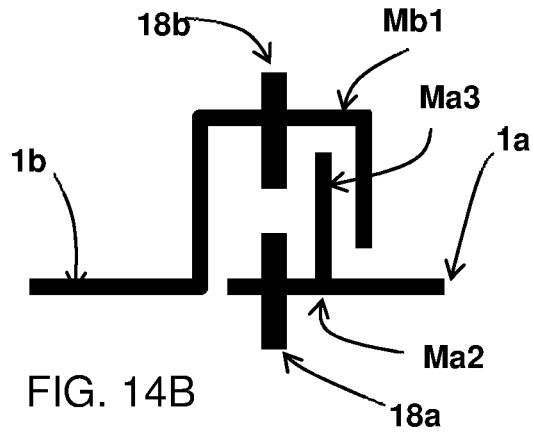

FIGS. 14A and 14B show two embodiments of adjacent preformed solar panels 1a, 1b fixed to each other by their mounting region Ma2, Mb1. In the embodiment of FIG. 14A, the first preformed solar panel 1a has an upwardly bent mounting region Ma2 as shown in FIG. 14E. The second preformed solar panel 1b has a mounting region Mb1 formed as a hook that grips around the upwardly bent mounting region Ma2 of the first preformed solar panel 1a. The first mounting region of the second preformed solar panel 1b is shown in more detail in FIG. 14F. The preformed solar panels 1a, 1b are jointly attached to the roof by a fixation means 18, such as a screw or a bolt. FIG. 14H is a picture of preformed solar panels 1a, 1b, 1c that are assembled to a roof RF with the connection of FIG. 14A, in this case without visible fixation means. FIG. 14I show a detail of this connection, between the preformed solar panels 1a and 1b in FIG. 14H. FIG. 14G shows an example of a preformed solar panel 1a with a backwards bent mounting region Ma2 which may cooperate with a corresponding mounting region of another panel gripping therein.

FIG. 14B shows a variation of the embodiment of FIG. 14A. Parts therein corresponding to those in FIG. 14A have the same reference number. In the variation shown in FIG. 14B, the mounting region Ma2 of preformed solar panel 1a comprises an upwardly pointing edge part Ma3, which is fused to the end of the panel 1a. The preformed solar panels 1a, 1b are jointly attached to the roof by mutually cooperating fixation means 18a, 18b, such as a bolt and nut, or by elements that form a snap connection.

Figure 14C:
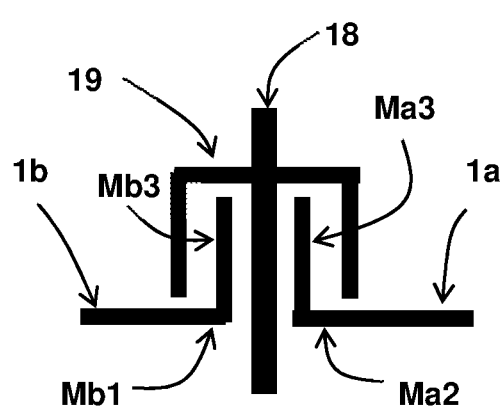
FIG. 14C, 14D shows examples of solar panels having mounting regions cooperating with a capping element.
Figure 14D:
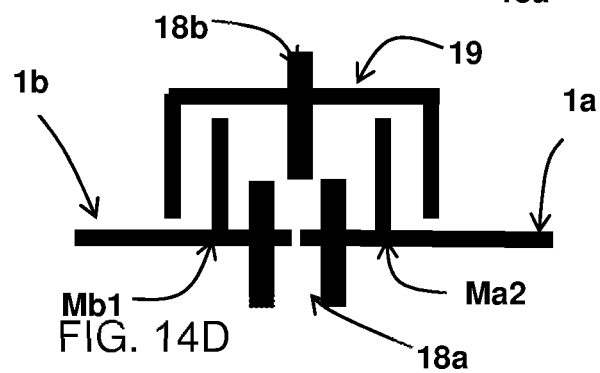
Figure 14E:
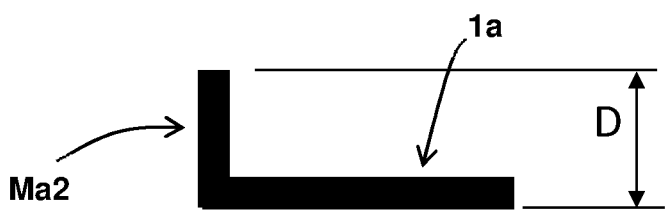
FIGS. 14E, 14F and 14G shows exemplary mounting regions in more detail.
Figure 14F:
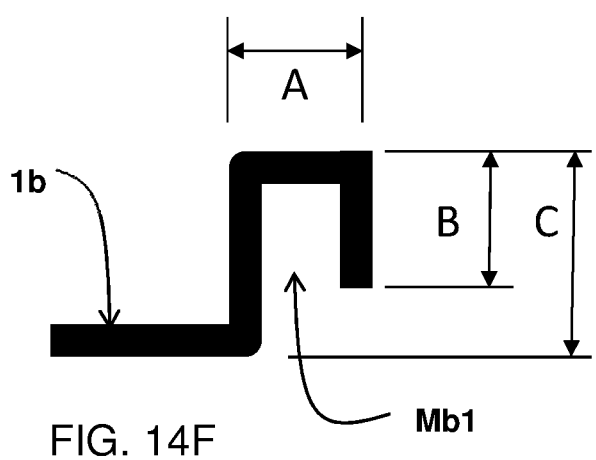
Figure 14G:
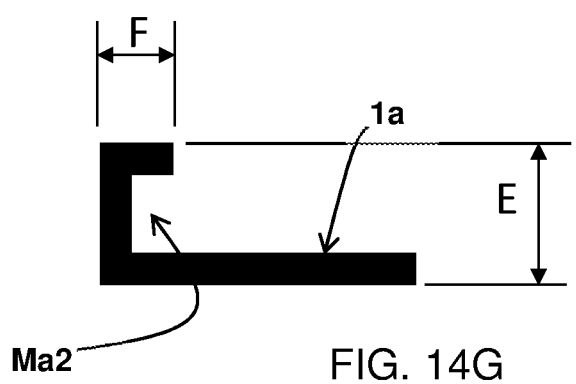
Figure 14H:
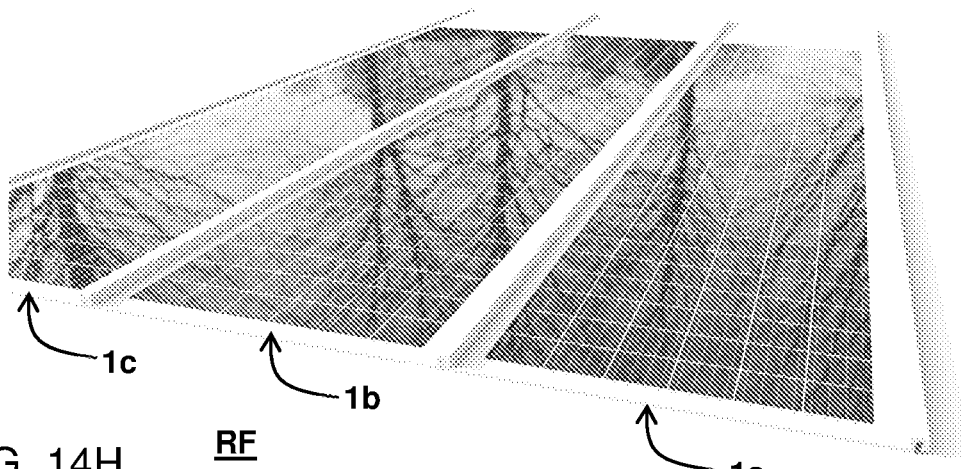
FIG. 14H shows a assembly of solar panels.
Figure 14I:
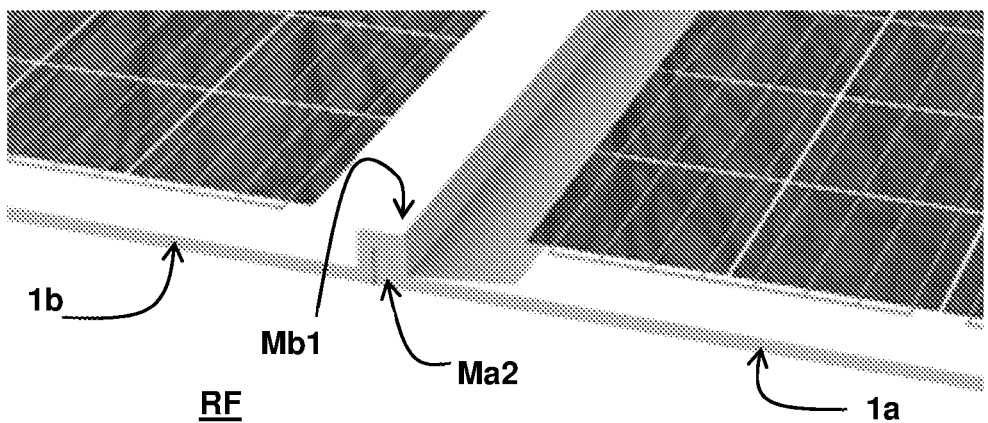
FIG. 14I shows a detail of FIG. 14H.

In the embodiment of FIG. 14C neighboring panels 1a, 1b have the same upwardly bent mounting region Mb1, Ma2 as shown in FIG. 14E, and a capping member 19 is fixed over these upwardly bent mounting region Mb1, Ma2 by fixation means 18. In the variation shown in FIG. 14D parts corresponding to those in FIG. 14C have the same reference number. In the variation shown in FIG. 14D, the mounting regions Ma2, Mb1 of preformed solar panela 1a, 1b comprise an upwardly pointing edge part Ma3, Mb3, which is fused to their end. The preformed solar panels 1a, 1b are jointly attached to the roof by a capping member 19 and mutually cooperating fixation means 18a, 18b, such as a bolt and nut, or by elements that form a snap connection.

Figure 15:
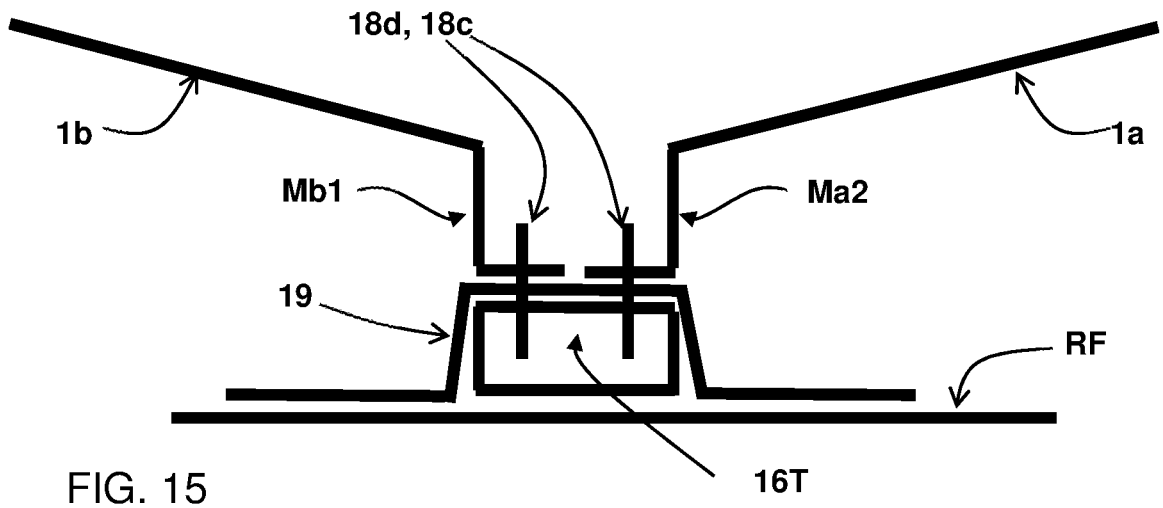
FIG. 15 shows an alternative fixation of a pair of solar panels.

FIG. 15 shows a still further example. Parts therein corresponding to those in FIG. 14A-14I have a same reference number. In the embodiment shown therein a tubular mounting element 16T with rectangular cross-section is mounted to roof RF, for example with Velcro tape or by other means. The tubular mounting element 16T is capped by capping element 19, which may also be fixed to the roof by an adhesive or by Velcro tape or the like, and which may also serve for fixation of tubular mounting element 16T. In some cases this fixation may be sufficient, so that no further means are required for fixation of the tubular mounting element 16T. Finally, the preformed solar panels 1a, 1b are mounted with their mounting regions Ma2, Mb1 to the tubular mounting element 16T, for example with screws 18c, 18d.

Figure 16A:
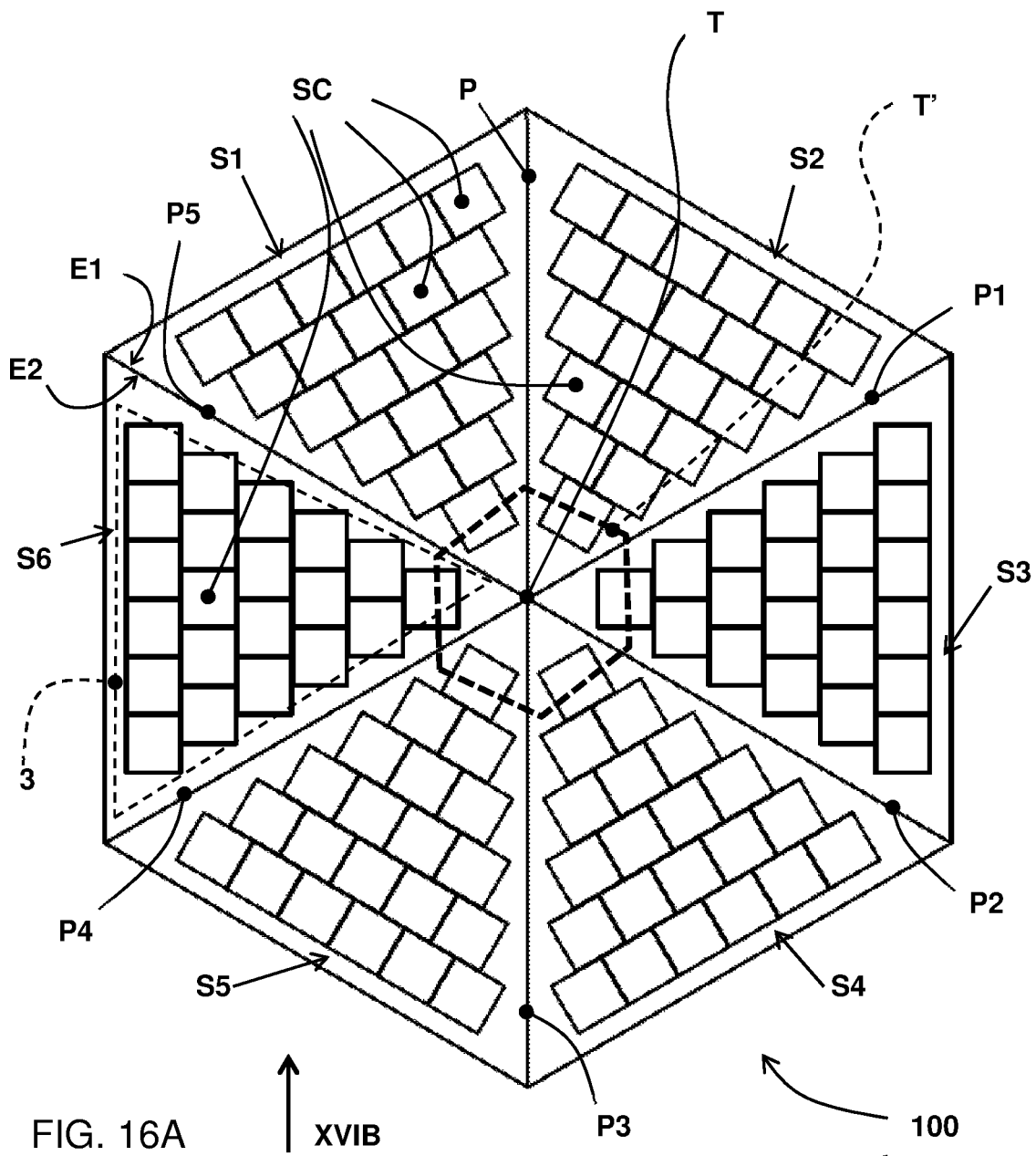
FIG. 16A, 16B respectively show a top view and a side view of a solar-panel pyramid.
Figure 16B:
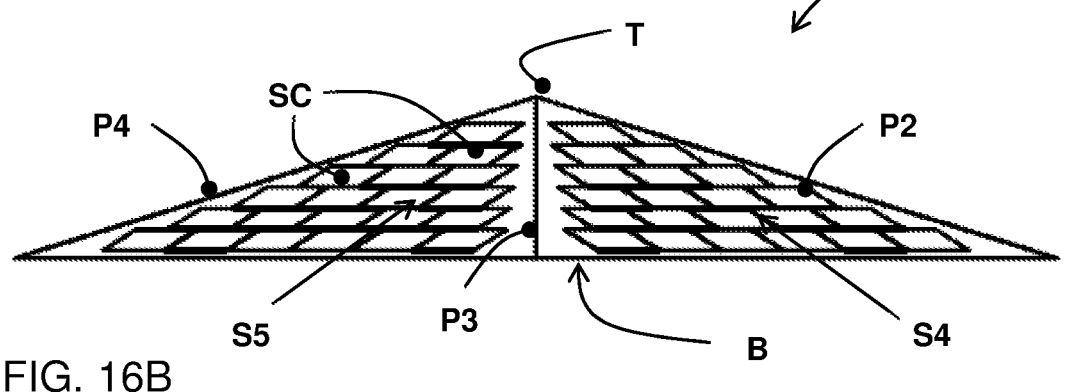
Figure 17:
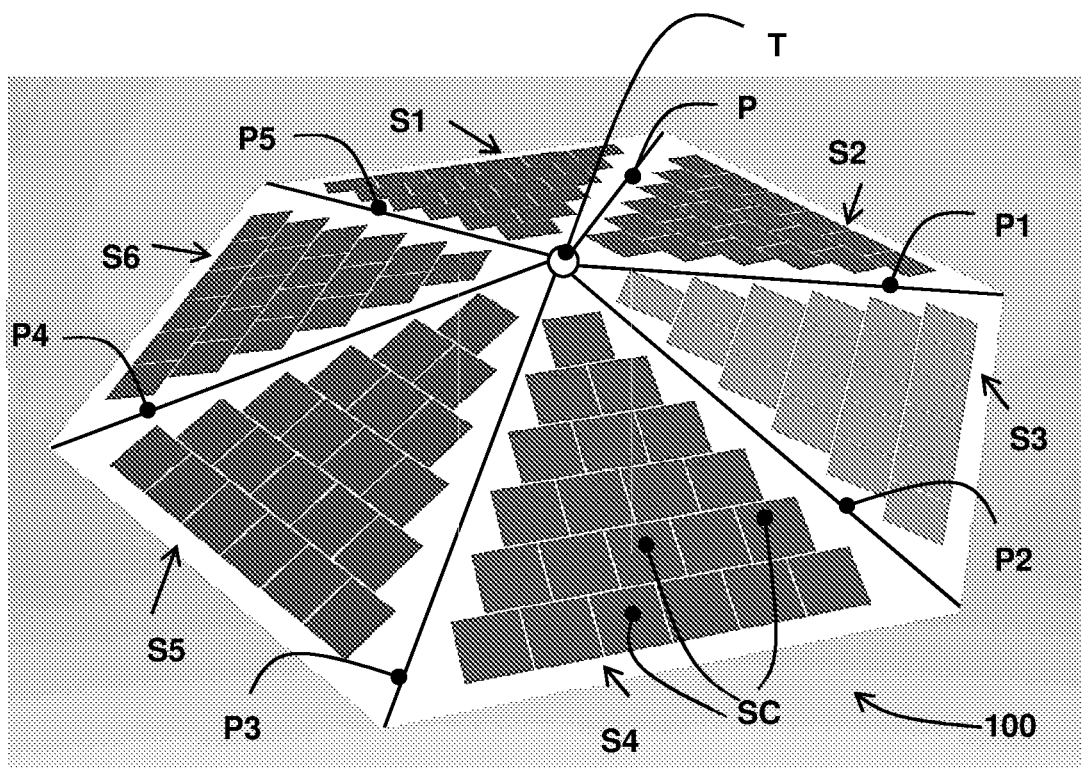
FIG. 17 shows a perspective view of a solar-panel pyramid.

In an embodiment as shown in FIG. 16A, 16B and FIG. 17 a preformed solar panel is configured into a solar panel pyramid 100. Therein FIG. 16A shows a top-view, FIG. 16B shows a side-view according to XVIB in FIG. 16A, and FIG. 17 shows a perspective view. The preformed solar panel is configured into a solar panel pyramid 100 comprises at least three, in this case six triangular shaped planar sections S1, S2, ..., S6. The triangular planar sections having a common top T. In this example, the sections S1 may for example have a side remote from the top that has a width in the order of 100 to 150 cm, for example about 125-130 cm. Solar cells, e.g. 21 rectangular cells having a size of about 160×160 mm may be arranged thereon as a first row of 6 cells, a second row of 5 cells etc. In this arrangement, a distance of the top of a triangular planar section to the middle of its base can be of the same order of magnitude as the dimension of its base. Therewith the height of the solar panel pyramid constituted from the triangular planar sections S1, ..., S6 is in the order of halve the height of the base side, in this example about 60 to 70 cm, and the angle between neighboring triangular planar sections is in the order of 140 degrees. If the solar pyramid is provided on a water surface, then if necessary, a floating element, e.g. an airbag may be accommodated within the pyramid, so as to lift all solar cells sufficiently above the water surface. Each planar section (e.g. S2) shares a first plastically deformed section (e.g. P) with a first neighboring planar section (e.g. S1), and shares a second plastically deformed section (e.g. P1) with a second neighboring planar section (e.g. S2). The edges of the planar sections S1-S6 opposite said top T define a base-plane B of the solar panel pyramid 100. The plastically deformed sections P, P1, P2, ... P5, include a plastically deformed section P5 between the first end E1 and the second opposing end E2. Each triangular section S1, ... , S6, has a photovoltaic layer 3, as for example shown for section S6, having a plurality of photovoltaic cells SC, which are typically arranged in series. It is noted that a truncated pyramid may be formed from truncated triangles, and having a top T' as schematically indicated in FIG. 13A.

Figure 18:
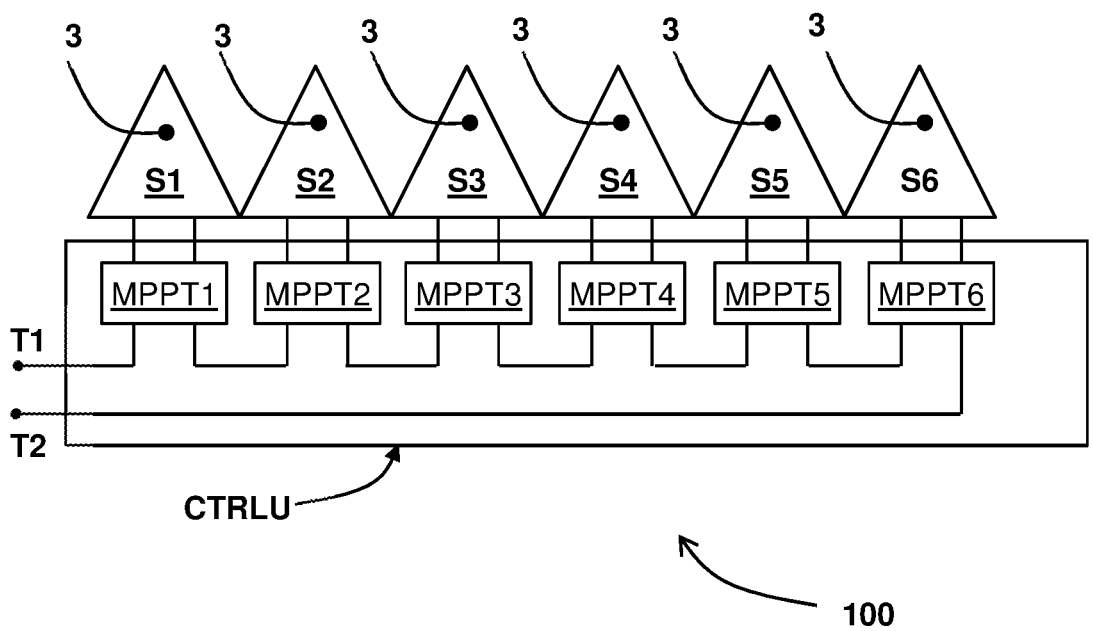
FIG. 18 schematically shows a solar panel pyramid provided with a control unit.

FIG. 18 schematically shows a solar panel pyramid provided with a control unit CTRLU. The control unit CTRLU has a respective Maximum Power Point Tracker MPPT1, ..., MPPT6 for each photovoltaic layer 3 associated with a respective substantially triangular planar section S1, ..., S3. The outputs of the trackers are arranged in series between output terminals T1, T2.

Alternatively, it could be contemplated to simply arrange the photovoltaic layers of the sections S1, ..., S6 in series, bridging each of the sections with a bypass diode. However in that case sections that have a lower light exposure would limit the power output or not contribute any output power (depending on the type of bypass device), whereas in the embodiment of FIG. 18 they still do provide an optimal contribution.

In another configuration, the photovoltaic layers of the section S1, ..., S6 are connected in parallel. In this case the sections can deliver their contribution in proportion to the light exposure. As compared to the configuration of FIG. 18, however, this parallel configuration would operate at a lower output voltage and a higher output current, and therewith result in higher resistive losses and the requirement of thicker, more expensive cables.

In a still further configuration, the corresponding sections of mutually different solar panel pyramids are arranged in series. This would have the advantage that the serial connection is provided for solar panel elements having a comparable light exposure, so that all sections efficiently contribute. This configuration however involves significant cabling costs, as a multitude of cables has to be provided. In the case of a hexagonal pyramid arrangement a first set of two cables (+ and −) would be required for the S1 sections of a series of pyramids, a second set for the S2 sections, etc., resulting in a total of six sets of cables.

FIG. 19A-19D schematically show an aspect of a method of manufacturing a solar panel pyramid. Therein FIG. 19A shows how preformed solar panels 100A, 100B, 100A', 100B' etc, ... each having three, triangular planar sections S1-S3, S4-S6, S1'-S3', S4'-S6' are manufactured as portions of a planar semi-finished product. These portions 100A, 100B, 100A', 100B' can be cut along lines C1, C2, C3 from the planar semi-finished product with very low material losses.

FIG. 19B shows how two preformed solar panels 100A, 100B are mutually positioned to be subsequently merged into a larger preformed solar panel 100AB, as shown in FIG. 19B. As shown in FIG. 19B, 19C, the two preformed solar panels 100A, 100B are merged by contacting the first intermediate edge portion e12 of portion 100A and the second intermediate edge portion e21 of portion 100B and heating these edge portions e12, e21 for a time and temperature suitable to fuse the first and the second preformed solar panel 100A, 100B to obtain the preformed solar panel 100AB of FIG. 19C with at least three, at least substantially triangular planar sections. Optionally, contacting, may be achieved via a strip of a thermoplastically deformable material, in that case also that strip is to be heated, at least at the locations where it contacts the intermediary edge portions e12, e21, for a time and temperature suitable to fuse therewith.

In the final step, shown in FIG. 19C, 19D, in the same manner, the remaining edge portions e1, e2 of preformed solar panel 100AB are connected to form the solar-panel pyramid 100.

Figure 20A:
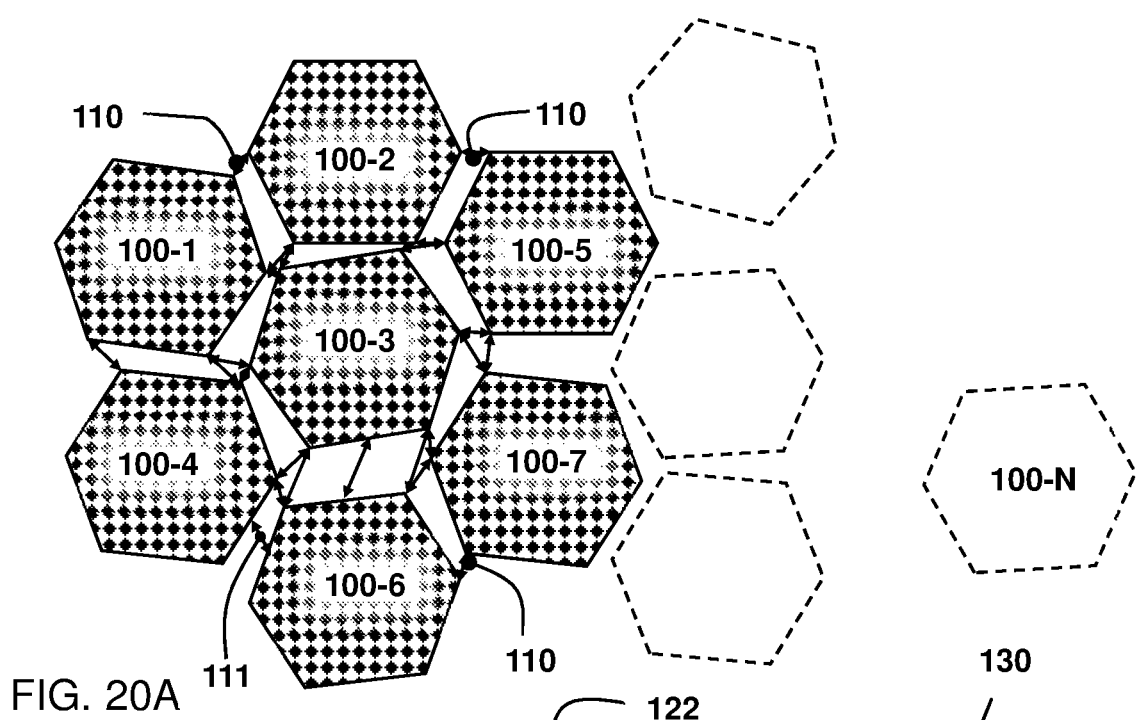
FIG. 20A, 20B, show examples of a solar panel pyramid arrangement.
Figure 20B:
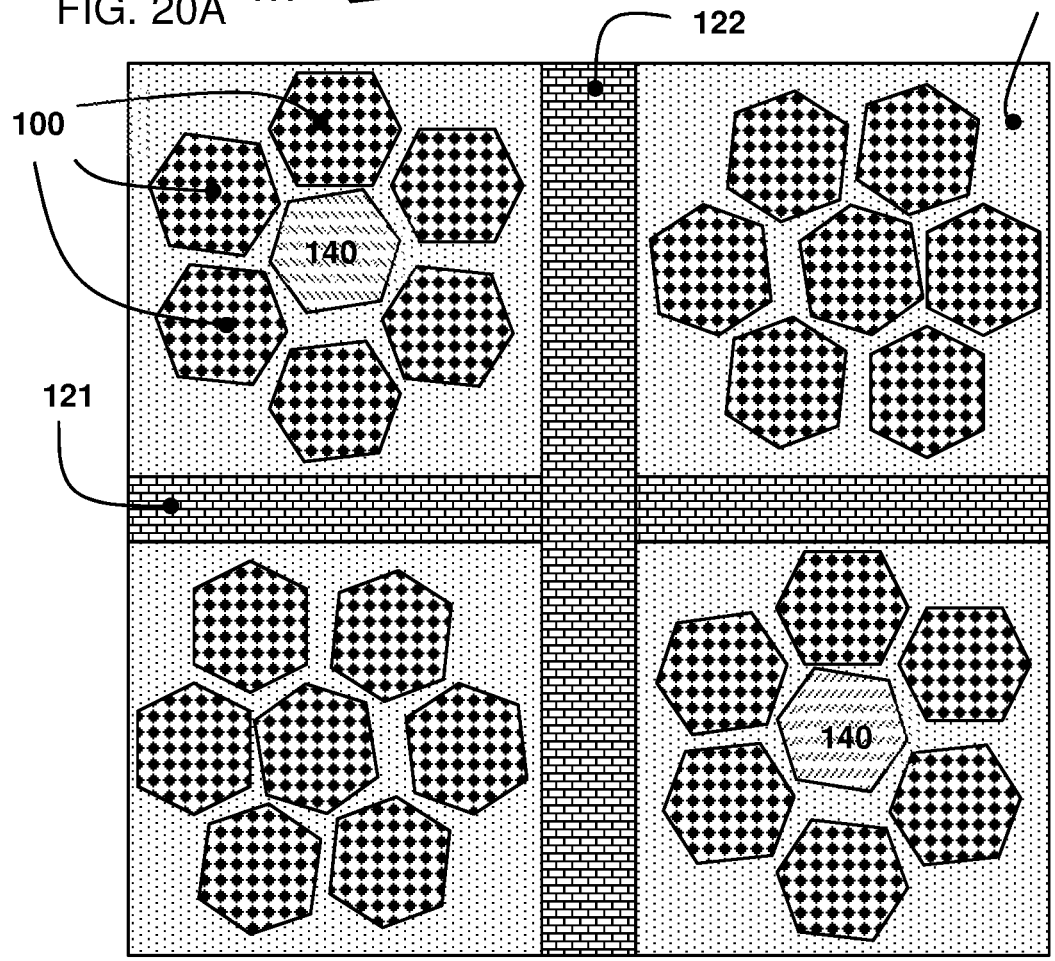

FIG. 20A, 20B, show examples of a solar panel pyramid arrangement that comprises a plurality of solar-panel pyramids 100-1, 100-2, ..., 100-N. In the embodiment of FIG.

20A, mutually neighboring solar-panel pyramids are mechanically elastically coupled, here by flexible joints 110. Alternatively or additionally flexible joints 111 may be provided at an other location, for example at each side at a central position of a respective neighboring side of neighboring pyramids.

Buffer elements (not shown) may be provided to avoid that neighboring solar-panel pyramids can directly touch each other. Alternatively, as shown in FIG. 20B, the solar-panel pyramids may be mounted to a web, which may be pre-tensioned. In the embodiment of FIG. 20B, also maintenance paths 121, 122 are provided that extend through the arrangement, to enable access of individual solar-panel pyramids. At some locations vacancies 140 are provide where the sea surface is exposed to allow sunlight to enter the water surface, and to provide for a contact with the atmosphere.

Figure 21A:
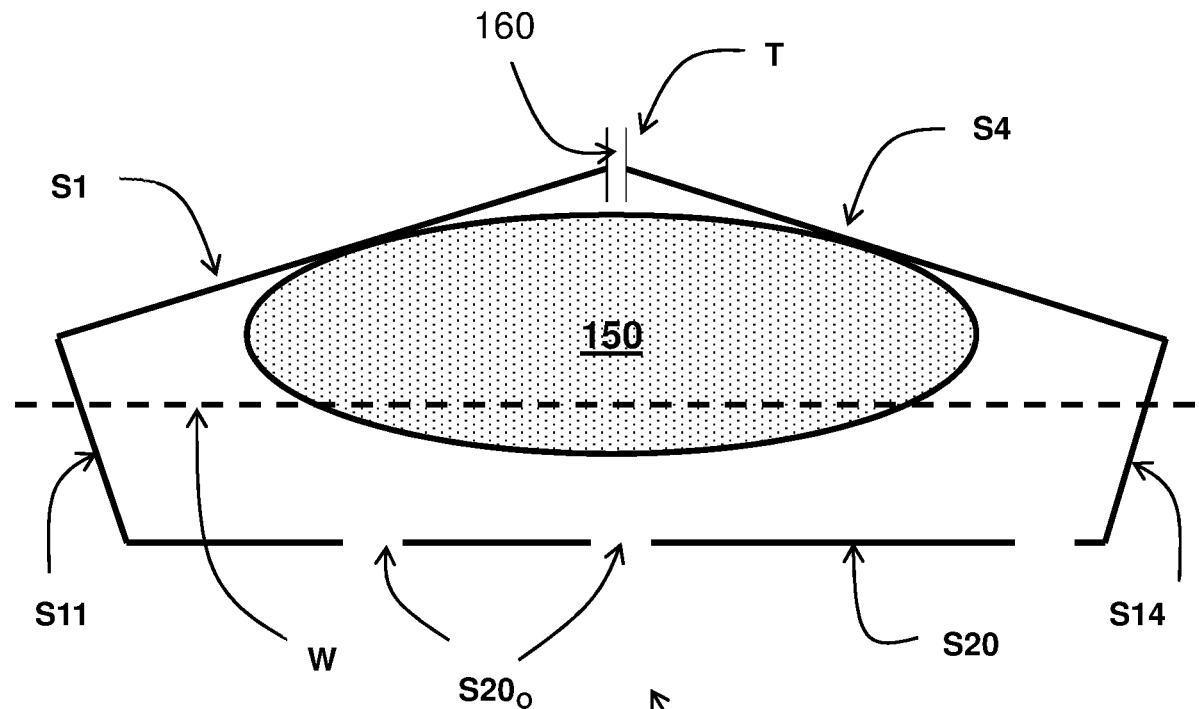
FIGS. 21A and 21B, show two examples of solar panel pyramids suitable to be arranged on a water surface.
Figure 21B:
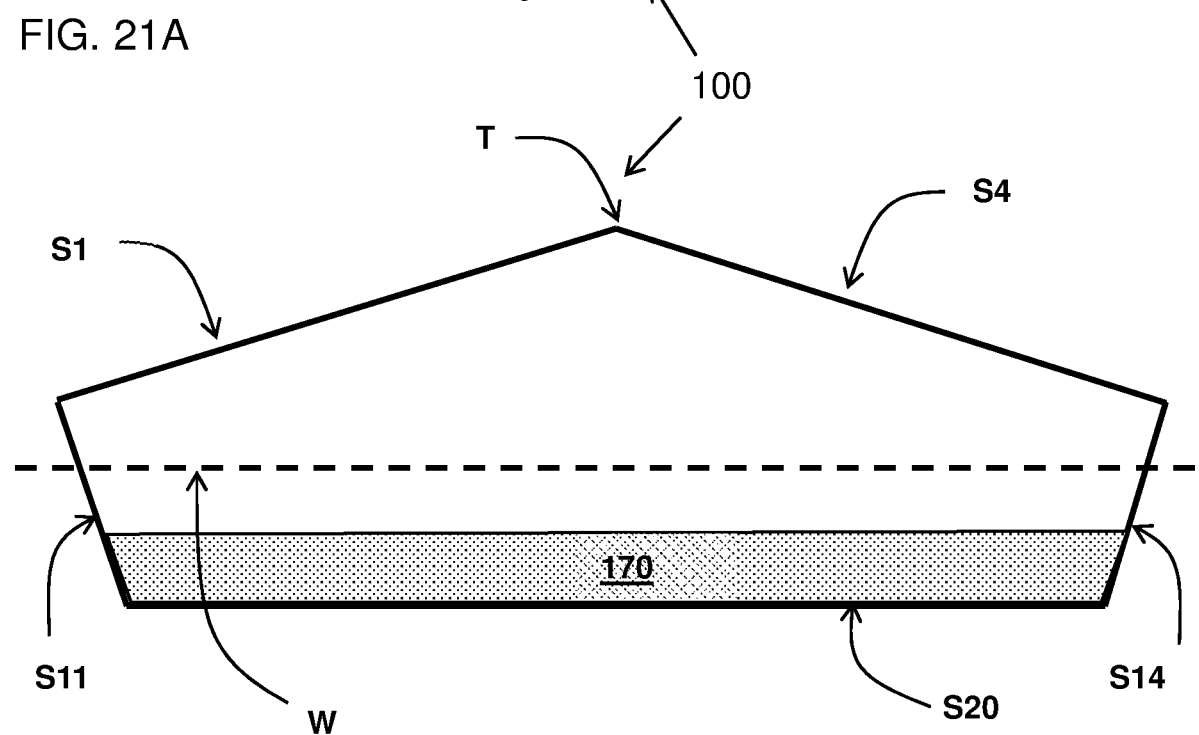

FIG. 21A, 21B schematically shows further embodiments of solar panel pyramids configured to float on a water surface W. In these embodiments, the solar panel pyramid 100 further comprises a truncated pyramid part, which is oriented in a direction opposite to that of the pyramid formed by the at least substantially triangular planar sections S1, . . . , S6. The truncated pyramid part comprises a plurality of trapezoid planar sections S11, S16 (See FIG. 22) and a polygonal planar bottom section S20. Each of the triangular planar sections S1, . . . , S6 is connected at its edge opposite to the top T via a respective plastically deformed section to a respective one of the trapezoid planar sections S11, . . . , S16. For example Si is connected to S11 and S4 is connected to S14. Furthermore, pairs of neighboring trapezoid planar sections S11, . . . , S16 are connected in a respective plastically deformed section to each other, and each trapezoid planar section S11, . . . , S16 is connected in a respective plastically deformed section at an edge facing away from the top to a respective edge of the polygonal planar bottom section S20.

In the embodiment of FIG. 21A, the solar panel pyramid 100 further comprises an air-bag 150 accommodated in its interior. Additionally, an air valve 160 is provided at a side which is in use configured to be above water level W, and openings $S20_O$ are provided at a side which is in use configured to be below water level W. The openings may be sufficiently large to enable water to penetrate into the interior, but to prevent that crustacean can enter the interior, risking damaging of the airbag 150.

In the embodiment of FIG. 21B, the solar panel pyramid 100 defines a closed volume that is partly filled with air and partly filled with a ballast 170.

Figure 22:
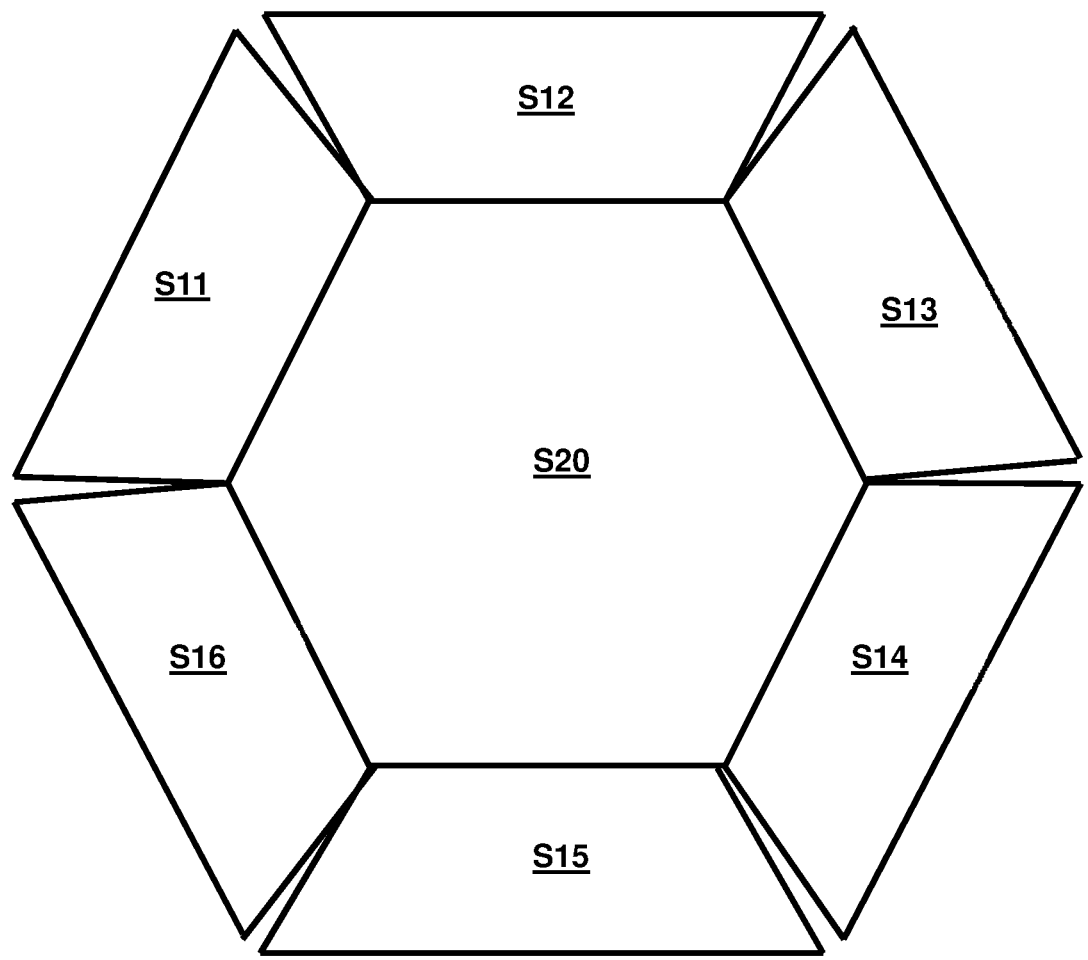
FIG. 22 shows an intermediary product for use in manufacturing a solar panel pyramids as shown in FIG. 21A or 21B.

FIG. 22 shows a semi-finished component, with which in combination with the product shown in FIG. 19D a solar panel pyramid as shown in FIG. 21A or 21B can be manufactured. The semi-finished product shown in FIG. 22 comprises a polygonal planar bottom section S20 and trapezoid sections S11, . . . , S16 that connected at respective sides of the polygonal planar bottom section S20. The semi-finished product shown in FIG. 22 may be manufactured for example from a same planar material as that shown in FIG. 19A. As shown in FIG. 22, the trapezoid planar sections S11, . . . , S16 widen in a direction away from the polygonal planar section S20. The trapezoid planar sections S11, . . . , S16 are tilted inwards along their edge with the polygonal planar section S20, and each pair of neighboring trapezoid planar sections S11-S12; S12-S13; S13-S14; S14-S15; S15-S16 and S16-S11 are connected at in a respective thermoplastically deformed zone. In one example the neighboring edges are directly fused together, and in another embodiment the neighboring edges are fused through an intermediary strip of material. Finally, the remaining, most outward edges of the trapezoid planar sections are connected with a respective triangular planar section in in a respective thermoplastically deformed zone in the base plane of the solar panel pyramid. Likewise, this connection may be achieved by direct fusing or through an intermediary strip of material. In an embodiment, this final step of connecting the trapezoid planar sections with the triangular planar sections is performed at the location of use of the solar panel pyramid 100. This is advantageous in that the top parts can be stacked as well as the bottom parts during transport to the location of use.

For the purpose of clarity and a concise description, features are described herein as part of the same or separate embodiments, however, it will be appreciated that the scope of the invention may include embodiments having combinations of all or some of the features described. For example, while embodiments are shown for pre-formed panels and assemblies thereof, also panels with differently shaped and/or dimensioned mounting regions may be envisaged by those skilled in the art having the benefit of the present disclosure for achieving a similar function and result. The various elements of the embodiments as discussed and shown offer certain advantages, such as a low weight, improved ease of assembly, and ease of fabrication. Of course, it will be appreciated that any one of the above embodiments or processes may be combined with one or more other embodiments or processes to provide even further improvements in finding and matching designs and advantages. It is appreciated that this disclosure offers particular advantages to panel manufacturing and panel assemblies, e.g. mounting, and in general can be applied for any application wherein photovoltaic sandwich panels are used.

In interpreting the appended claims, it should be understood that the word "comprising" does not exclude the presence of other elements or acts than those listed in a given claim; the word "a" or "an" preceding an element does not exclude the presence of a plurality of such elements; any reference signs in the claims do not limit their scope; several "means" may be represented by the same or different item(s) or implemented structure or function; any of the disclosed devices or portions thereof may be combined together or separated into further portions unless specifically stated otherwise. Where one claim refers to another claim, this may indicate synergetic advantage achieved by the combination of their respective features. But the mere fact that certain measures are recited in mutually different claims does not indicate that a combination of these measures cannot also be used to advantage. The present embodiments may thus include all working combinations of the claims wherein each claim can in principle refer to any preceding claim unless clearly excluded by context.

The invention claimed is:

1. A pre-formed solar panel configured to be mounted on a support plane, wherein the pre-formed solar panel comprises:
   a first planar section;
   a plastically deformed section; and
   a second planar section,
   wherein the pre-formed solar panel has, in a direction from a first opposing end to a second opposing end, at least the first planar section, the plastically deformed section, and the second planar section, wherein the plastically deformed section maintains the first planar section and the second planar section relative to each other at an enclosed angle in a range between 30° and 170°, wherein an area of at least one of the first planar section and the second planar section is provided with a photovoltaic layer, wherein both the first planar section and the second planar section are formed with a common back panel comprising a honey comb panel formed of a thermoplastically deformable polymer composition sandwiched between a fiber reinforced front sheet thermoplastic polymer top layer and a fiber reinforced back sheet thermoplastic polymer bottom layer, wherein, between the first apposing end and the second opposing end, the pre-formed solar panel is formed as a stack comprising:
a protective front layer;
the common back panel; and
the photovoltaic layer sandwiched between the back panel and the protective front layer, wherein the first planar section has a first length and the second planar section has a second length, respectively, between the plastically deformed section and a respective opposing end of the first opposing end and the second opposing end of the pre-formed solar panel such that, after being mounted on a support plane, the pre-formed solar panel has a panel height, defined as a distance between the support plane and the plastically deformed section, in a range between 20 and 150 cm;

wherein the first length of the first planar section and the second length of the second planar section are such that, after being mounted on the support plane, an enclosed angle, in a range between 10° and 90°, is defined between:
a planar section, of the first planar section and the second planar section, having the photovoltaic layer, and
the support plane; and
wherein a stiffness of the pre-formed solar panel between the first opposing end and the second opposing end is in a range between 100-5000 N/m.

2. The pre-formed solar panel according to claim 1, further comprising a side-panel at one or more sides of the pre-formed solar panel, wherein the side panel reduces a wind load on the pre-formed solar panel after being mounted on the support plane.

3. The pre-formed solar panel according to claim 1, wherein the pre-formed solar panel comprises at least one mounting region provided on the back panel along an edge portion of at least the first opposing end and the second opposing end of the pre-formed solar panel,
wherein the at least one mounting region includes at least one of the group consisting of:
an adhesive for adhering the pre-formed solar panel to the support plane;
cuts extending in a direction away from the edge portion of the pre-formed solar panel; and
a pattern arranged to, when mounted, interlock with a patterned mounting region of an adjacent pre-formed solar panel or with a patterned mounting region of a mounting element.

* * * * *